United States Patent
Yamamoto

(10) Patent No.: US 11,281,740 B2
(45) Date of Patent: *Mar. 22, 2022

(54) INFORMATION PROCESSING DEVICE, INFORMATION PROCESSING METHOD, PROGRAM AND STORAGE MEDIUM

(71) Applicant: Rakuten Group, Inc., Tokyo (JP)

(72) Inventor: Yoji Yamamoto, Tokyo (JP)

(73) Assignee: Rakuten Group, Inc., Tokyo (JP)

( * ) Notice: Subject to any disclaimer, the term of this patent is extended or adjusted under 35 U.S.C. 154(b) by 423 days.

This patent is subject to a terminal disclaimer.

(21) Appl. No.: 16/343,478

(22) PCT Filed: Oct. 20, 2016

(86) PCT No.: PCT/JP2016/081144
§ 371 (c)(1),
(2) Date: Apr. 19, 2019

(87) PCT Pub. No.: WO2018/073942
PCT Pub. Date: Apr. 26, 2018

(65) Prior Publication Data
US 2019/0251136 A1    Aug. 15, 2019

(51) Int. Cl.
*G06F 16/00* (2019.01)
*G06F 16/957* (2019.01)
(Continued)

(52) U.S. Cl.
CPC .......... *G06F 16/9574* (2019.01); *G06F 12/00* (2013.01); *G06F 16/215* (2019.01);
(Continued)

(58) Field of Classification Search
None
See application file for complete search history.

(56) References Cited

U.S. PATENT DOCUMENTS

| 9,396,131 B1* | 7/2016 | Hendry ................ G06F 3/0608 |
| 2011/0082842 A1* | 4/2011 | Groseclose, Jr. ....... G06F 3/067 |
| | | 707/693 |

(Continued)

FOREIGN PATENT DOCUMENTS

| JP | 2002-132546 A | 5/2002 |
| JP | 2007-328750 A | 12/2007 |

(Continued)

OTHER PUBLICATIONS

U.S. Appl. No. 16/343,475, Yoji Yamamoto, filed Apr. 19, 2019.
(Continued)

*Primary Examiner* — Anhtai V Tran
(74) *Attorney, Agent, or Firm* — Sughrue Mion, PLLC

(57) ABSTRACT

An information processing device obtains an increasing tendency of a storage capacity utilized by a blog containing at least one article, sets, to the blog, a threshold for determining whether or not to compress at least a part of the article contained in the blog in accordance with the increasing tendency, determines whether or not the blog is to be compressed based on a total data amount of the at least one article contained in the blog and on the threshold, and determines whether or not to compress each of the at least one article contained in the blog in accordance with a degree of accessibility.

9 Claims, 18 Drawing Sheets

(51) Int. Cl.
*G06F 16/51* (2019.01)
*H03M 7/30* (2006.01)
*G06F 16/215* (2019.01)
*G06F 16/958* (2019.01)
*G06F 12/00* (2006.01)

(52) U.S. Cl.
CPC ............ *G06F 16/51* (2019.01); *G06F 16/986* (2019.01); *H03M 7/30* (2013.01); *H03M 7/6011* (2013.01); *H03M 7/6082* (2013.01); *H03M 7/707* (2013.01)

(56) References Cited

U.S. PATENT DOCUMENTS

2012/0124016 A1  5/2012  Barsness et al.
2012/0198059 A1* 8/2012  Clary ................... G06F 16/958
                                                       709/224

FOREIGN PATENT DOCUMENTS

JP   2008-176616 A   7/2008
JP   2010-044468 A   2/2010

OTHER PUBLICATIONS

U.S. Appl. No. 16/343,459, Yoji Yamamoto, filed Apr. 19, 2019.
Office Action dated Aug. 16, 2021 in U.S. Appl. No. 16/343,475.
International Search Report for PCT/JP2016/081142, dated Jan. 10, 2017.
International Search Report for PCT/JP2016/081143, dated Jan. 10, 2017.
International Search Report for PCT/JP2016/081144, dated Jan. 10, 2017.

* cited by examiner

FIG. 4

MANAGING DB 53

| BLOG ID | USER INFORMATION | BLOG MANAGING INFORMATION | BLOG ACTUAL-ACHIEVEMENT INFORMATION | SIZE INFORMATION | DETERMINATION INFORMATION | COMPRESSION AND DECOMPRESSION INFORMATION | COMPRESSED ARTICLE TAG |
|---|---|---|---|---|---|---|---|
| ... | ... | ... | ... | ... | ... | ... | ... |

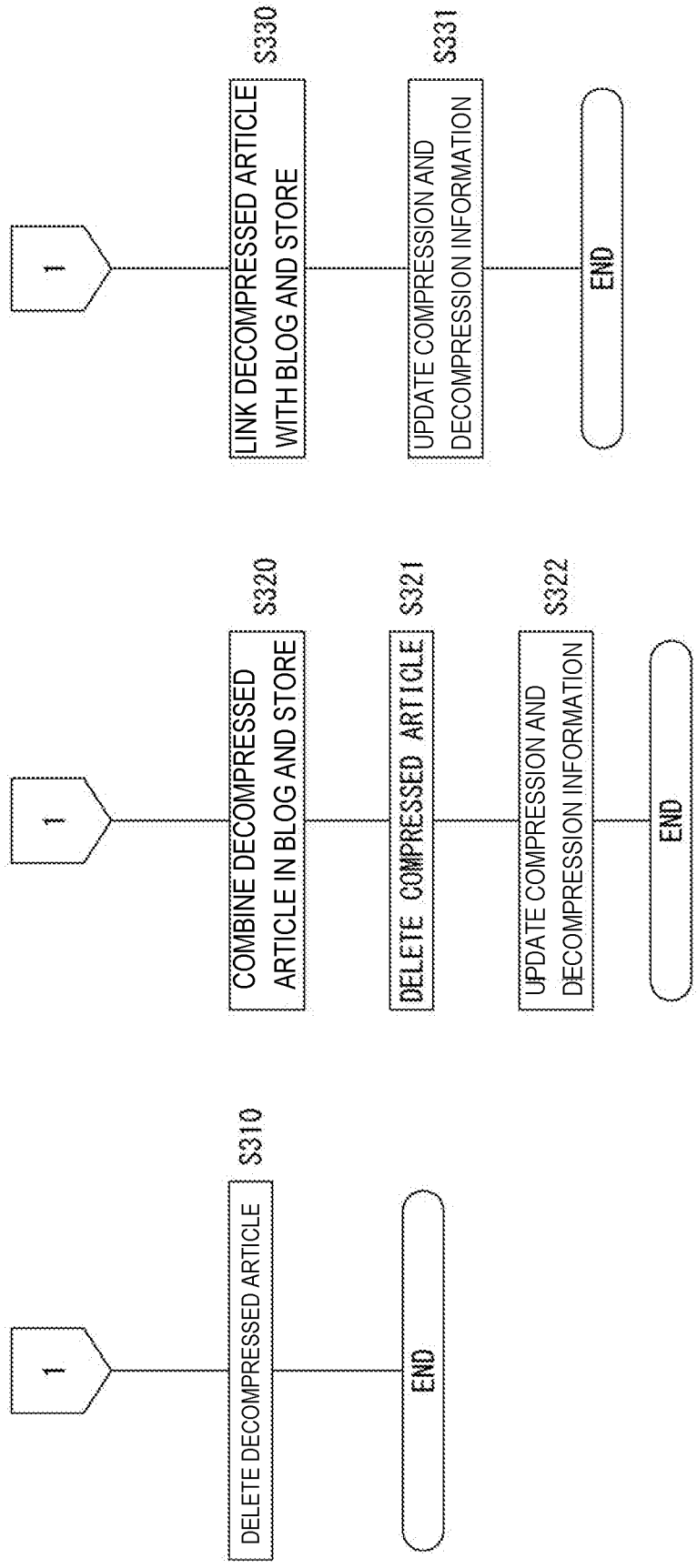

INFORMATION PROCESSING DEVICE, INFORMATION PROCESSING METHOD, PROGRAM AND STORAGE MEDIUM

CROSS REFERENCE TO RELATED APPLICATIONS

This Application is a National Stage of International Application No. PCT/JP2016/081144 filed Oct. 20, 2016.

TECHNICAL FIELD

The present disclosure relates to an information processing device, an information processing method, a program, and a storage medium, and more specifically, to technologies suitably applicable to a server device that manages a blog.

BACKGROUND ART

An example known service utilizing the Internet is a service that provides a blog environment. A user uploads an article that contains arbitrary sentences and images as a blog to a server, and the uploaded information is stored as a written article of the user. The stored blog is opened to the public in the form of, generally, a webpage. Moreover, the range to be opened to the public may be limited, or the blog is not opened to the public at all, and the like.

Many users utilize such a blog service as a tool for an own information dispatch, or as an alternative for a private diary.

Patent Literature 1 discloses a technology relating to a blog, e.g., a technology relating to an upload of an article.

Patent Literature 2 discloses a technology relating to a contents deletion in accordance with the insufficient remaining capacity of a server.

CITATION LIST

Patent Literatures

Patent Literature 1: JP 2007-328750 A
Patent Literature 2: JP 2010-44468 A

SUMMARY OF INVENTION

Technical Problem

In order to address the insufficient remaining capacity of the server, a scheme of lending a storage resource by a certain capacity to each user, and limiting a posting of a new article or deleting the article in an own blog as for the user who has exceeded the foregoing storage resource may be applicable.

However, there is a possibility such that the user feels discomfort if limitation in posting of the article and deletion of the article are forced. In particular, regarding deletion of a posted article, the user may think that the service quality is poor.

Hence, a blog and articles that have a low accessibility may be compressed to secure the storage resource, and the article may be decompressed and distributed when there is an access request to the compressed article.

However, compressing and decompressing processes have a high process load. The necessity of a decompression of the article when an access is made may decrease a performance possibly at the time of viewing such that a viewing user feels a slow response of a webpage due to such a process time. In view of the foregoing, it is preferable to reduce the number of compressing and decompressing processes as much as possible at the time of viewing.

Therefore, an objective of the present disclosure is to accomplish an effective utilization of a storage resource while avoiding a decompressing process at the time of viewing as much as possible by appropriately setting a condition for compression.

Solution to Problem

An information processing device according to the present disclosure includes: a tendency obtaining unit that obtains an increasing tendency of a storage capacity utilized by a blog that contains one or a plurality of articles; a threshold setting unit that sets, to the blog, a threshold for determining whether or not to compress at least a part of the article contained in the blog in accordance with the increasing tendency; and a determining unit which determines whether or not the blog is to be compressed based on a total data amount of the articles contained in the blog and on the threshold, and which determines whether or not to compress each of the articles contained in the blog in accordance with a degree of accessibility.

When the resource for storing the blog becomes tight because of the articles contained in the blog, the article that belongs to the blog may be compressed. In this case, the threshold for determining whether or not to compress is decided based on the increasing tendency of the necessary storage capacity for each blog.

The above-described information processing device may further include a compressing and decompressing unit which compresses the article determined by the determining unit as to be compressed, and which decompresses the already-compressed article when an access is made to the already-compressed article.

This compressing and decompressing unit compresses the article appropriately selected in accordance with the determination by the determining unit. Moreover, even if the article that is determined as having a low accessibility is compressed, there may be an access. In such a case, execution of the decompressing process appropriately provides the article to the accessing user.

In the above-described information processing device the compressing and decompressing unit may compress image data contained in the article determined as to be compressed when the compression is executed.

Image data often has a larger capacity than that of text data, and even if the compression percentage of the image data is lower than the compression percentage of the text data, the compression effect, i.e., the available capacity ensured when the compression is executed highly possibly increases. Hence, the image data is to be compressed.

In the above-described information processing device, the compressing and decompressing unit may compress data other than predetermined data on a header among the data contained in the article determined as to be compressed when the compression is executed.

Accordingly, when the audience views the article, transmission to the user terminal is enabled from the uncompressed header data.

In the above-described information processing device, the compressing and decompressing unit may execute lossy compression when compressing the image data contained in the article that is determined as the article to be compressed when the compression is executed.

This enables efficient compression on the article that has a low possibility to be viewed.

In the above-described information processing device, when the image data contained in the article to be compressed is compressed by lossless compression and the article having undergone the lossless compression becomes again the article to be compressed, the compressing and decompressing unit may execute lossy compression on the article.

Accordingly, even if the article has a low possibility to be viewed, such an article may be accidentally under such a circumstance. Hence, lossless compression is executed at first.

The above-described information processing device may further include a blog managing unit that increases or decreases a storage capacity permitted to a poster in accordance with a utilization status of the poster who posts the article on the blog.

There are various ways to utilize the blog, and there is a poster who has a fast increase in total data amount of the blog, but there is also a poster which has a slow increase. Regarding the blog that has the increasing total data amount, the article is compressed to manage the storage resource. When, however, the storage resource cannot be secured yet, the upper limit of the storage capacity permitted to the blog of the poster is changed to cope with the insufficiency.

In the above-described information processing device, when the already-compressed article is decompressed in accordance with an access request, the determining unit may determine the decompressed article as not the article to be compressed for a predetermined time period from the decompression.

That is, the decompressed article at the time of access is left as being decompressed for the predetermined time.

In the above-described information processing device: the determining unit may determine, for the already-compressed article, whether or not to decompress in accordance with a value that indicates an increasing tendency of a page view to the other article that belongs to the same blog; and the compressing and decompressing unit may decompress the already-compressed article in advance in accordance with the determination on whether or not to decompress.

When a given blog has the number of accesses keenly increased because of a certain popular article, the other article contained in such a blog has the increasing possibility such as to be accessed in future even if not accessed so far. Hence, the determination to decompress is made.

In the above-described information processing device, the determining unit may determine whether or not to decompress the already-compressed article based on contents of the article.

For example, as the contents of the compressed article, an article that contains a certain set keyword or a current-news word, an article for a specific theme, etc., are picked out, and those articles are to be decompressed.

An information processing method according to the present disclosure includes: a tendency obtaining step of obtaining an increasing tendency of a storage capacity utilized by a blog that contains one or a plurality of articles; a threshold setting step of setting, to the blog, a threshold for determining whether or not to compress at least a part of the article contained in the blog in accordance with the increasing tendency; and a determining step of determining whether or not the blog is to be compressed based on a total data amount of the articles contained in the blog and on the threshold, and determining whether or not to compress each of the articles contained in the blog in accordance with the degree of accessibility.

This information processing method enables the information processing device to appropriately determine the article to be compressed.

A program according to the present disclosure causes an information processing device to execute procedures corresponding to the above-described steps, respectively. A storage medium according to the present disclosure has stored therein the program. Those accomplishes the processes by the above-described information processing device.

Advantageous Effects of Invention

According to the present disclosure, since an appropriate article to be compressed is selectable, effective utilization of a storage resource is accomplished while avoiding a decompressing process at the time of viewing as much as possible.

BRIEF DESCRIPTION OF DRAWINGS

FIG. 4 is an explanatory diagram for a managing database according to the embodiment;

FIGS. 8A-8C are flowcharts of an example process after decompression according to the embodiment;

DESCRIPTION OF EMBODIMENTS

Embodiments will be described below in the following sequence.

<1. System Configuration>
<2. Blog Server and Database>
<3. First Embodiment>
<4. Second Embodiment>
<5. Third Embodiment>
<6. Fourth Embodiment>
<7. Fifth Embodiment>
<8. Sixth Embodiment>
<9. Seventh Embodiment>
<10. Eighth Embodiment>
<11. Ninth Embodiment>
<12. Summary and Modified Example>
<13. Program and Storage Medium>

Note that, in the following description, a term "blog" means a webpage in the form of a diary called a weblog or simply a blog. More specifically, a blog server provides an environment (a storage capacity and a webpage) for forming a blog to a user, and the user uploads, in the form of posting, etc., an article that contains sentences and images to the own blog. A blog server normally provides such an article for a public (or limited range) viewing. However, the blog may be not opened to the public.

The contents of the article are not limited to any particular information. It may be information utilized for the user to information dispatch, or may be a private diary, etc. Moreover, equivalent contents although not called a "blog" are also treated as a blog.

The term "article" is an element which constitutes a blog, and indicates a unit (e.g., a posted unit) formed by sentences and images. The contents thereof are not limited to any particular information. Moreover, the article may be not only a single topic but also a group of articles to be viewed by a single URL for one or a plurality of topics.

Regarding the term "user", a user as a describer who writes an article in the own blog (a so-called blogger), and a user as an audience who views the other person's or own blog are expected. Those users are distinguished and referred to as the "describer" and the "audience". Needless to say, it is normally expected that a user may be a describer at a given time point but may become an audience at another time point.

A term "compression" means a so-called data compression, and is to convert various data, such as text data and image data, into another data that has decreased data amount while maintaining the substantial characteristics of the data.

A term "decompression" is to return the compressed data to the status before the compression. However, a case in which data does not completely return to the status before the compression like a case in which a so-called lossy compression is executed at the time of the compression is also involved. In this specification, an action to make at least the contents of the article viewable is called the "decompression".

1. System Configuration

Figure 1:
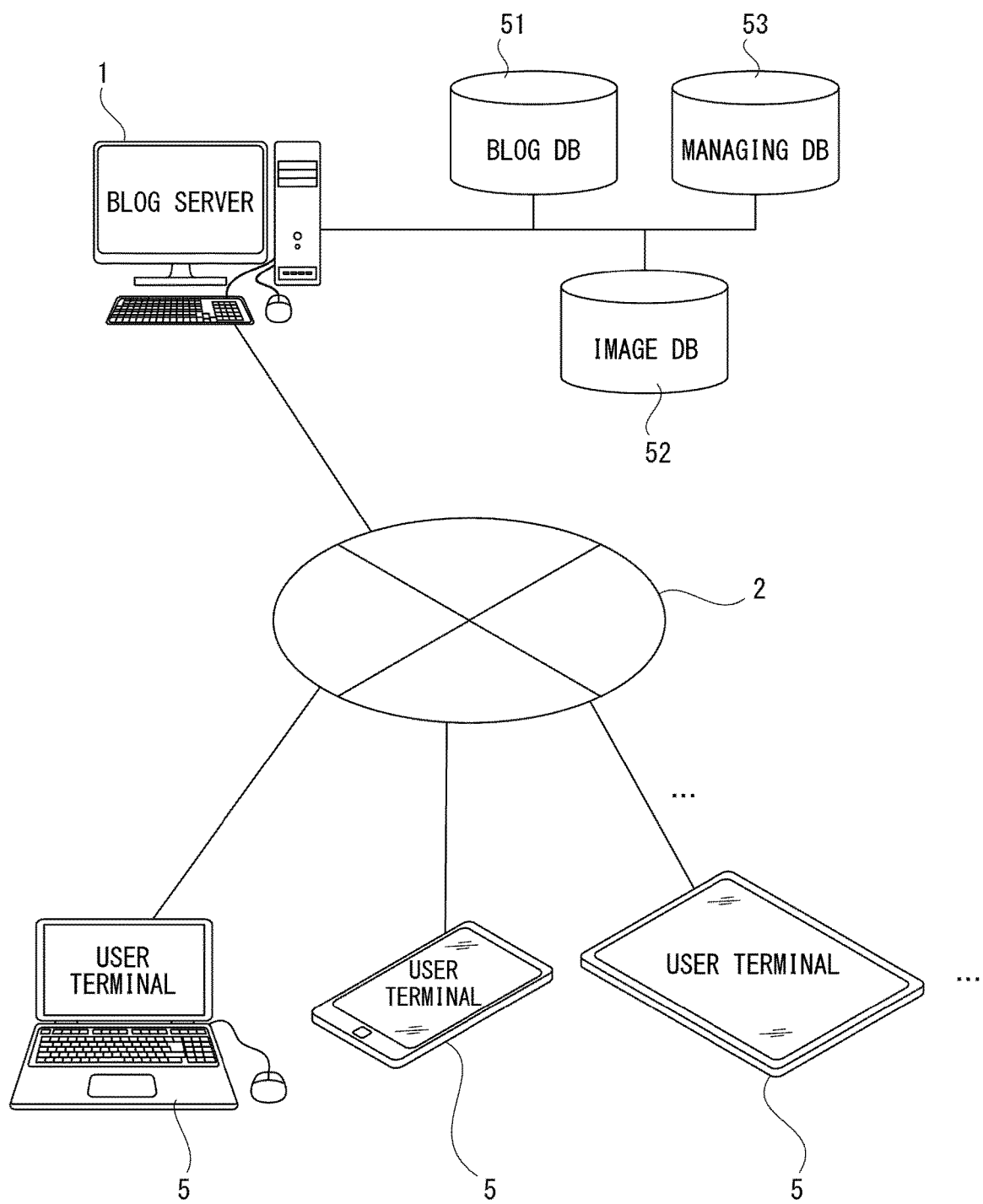
FIG. 1 is an explanatory diagram for a network that includes a blog server according to an embodiment of the present disclosure.

FIG. 1 illustrates an example structure of a network system that includes a blog server 1 according to an embodiment.

According to the network system of this embodiment, a blog server 1 and a plurality of user terminals 5 are connected together so as to be mutually communicable via a network 2.

Moreover, the blog server 1 is accessible to various databases. Note that the term "database" will be referred to as "DB" below. In the figure, a blog DB 51, an image DB 52, and a managing DB 53 are illustrated as the DBs to which the blog server 1 is accessible.

Regarding the structure of the network 2, various structures are expectable. For example, the Internet, an intranet, an extra network, a Local Area Network (LAN), a Community Antenna TeleVision (CATV) communication network, a Virtual Private Network (VPN), a telephone network, a mobile communication network, a satellite communication network, etc., are expectable.

Moreover, regarding a transmission medium that constitutes all of or a part of the network 2, various examples are also expectable. For example, wired schemes, such as Institute of Electrical and Electronics Engineers (IEEE) 1394, a Universal Serial Bus (USB), a power line transmission or a telephone line, or, wireless schemes, such as infrared ray like Infrared Data Association (IrDA), Bluetooth (registered trademark), 802.11 wireless communication, a mobile phone network, a satellite connection, or a terrestrial digital network, are applicable.

The blog server 1 is an information processing device utilized by an organization that manages and runs the blog service for the users. The blog server 1 provides a blog environment to the user (describer) and distributes webpage data like a blog article page to the user (audience) in response to an access request.

More specifically, for the describer who wants to open a blog, a webpage as the describer's blog is set, and user information is registered, and the like. For the describer who has already launched the blog, the article posted by the describer is stored.

Moreover, in response to the access request from the user who is a general audience, the webpage data corresponding to the related webpage is distributed.

This blog server 1 is equivalent to an embodiment of the information processing device as recited in the claims.

The user terminal 5 is a terminal utilized by the user as the describer or the audience. An example user terminal 5 is a Personal Computer (PC) with a communication function, a feature phone, a Personal Digital Assistant (PDA) or a smart device, such as a smartphone or a tablet terminal.

The user terminal 5 executes various kinds of transmitting and receiving processes, display processes, etc., as needed.

The audience is capable of arbitrarily viewing the interesting blog via a web browser on the user terminal 5.

The describer is capable of accessing and viewing the own blog page, and posting a new article via the user terminal 5.

The user terminal 5 is to execute a communicating process, a display process, etc., for these operations.

Figure 2:
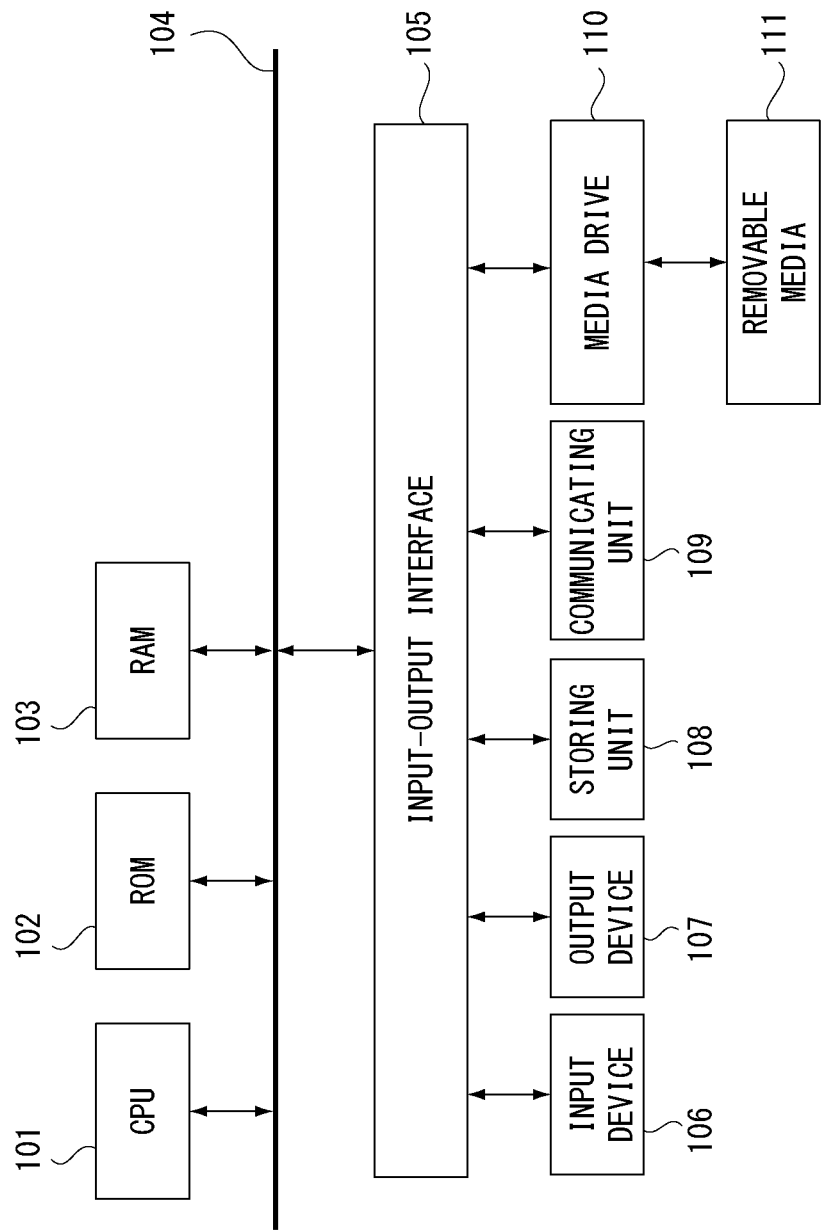
FIG. 2 is a block diagram of a computer apparatus that can be utilized in the embodiment.

FIG. 2 illustrates a hardware configuration of the information processing device that constructs the blog server 1 or the user terminal 5 as illustrated in FIG. 1. Each device illustrated as the blog server 1 or the user terminal 5 is achieved by a computer apparatus as illustrated in FIG. 2 and the computer apparatus is capable of an information processing and information communication.

In FIG. 2, a Central Processing Unit (CPU) 101 of the computer apparatus executes various kinds of processes in accordance with a program stored in a Read-Only Memory (ROM) 102 or a program loaded in a Random Access Memory (RAM) 103 from the storing unit 108. The RAM 103 also stores, as needed, necessary data, etc., for the CPU 101 to execute various kinds of processes.

The CPU 101, the ROM 102, and the RAM 103 are mutually connected with each other via a bus 104. An input-output interface 105 is also connected to this bus 104.

An input device 106, an output device 107, the storing unit 108, and a communicating unit 109 are connected to the input-output interface 105.

The input device 106 includes, for example, a keyboard, a mouse, and a touch panel. The output device 107 includes, for example, a display, such as a Liquid Crystal Display (LCD), a Cathode Ray Tube (CRT), an organic ElectroLuminescence (EL) panel, and a speaker.

The storing unit 108 includes, for example, a Hard Disk Drive (HDD), or a flash memory device.

The communicating unit 109 executes a communicating process and a device-to-device communication via the network 2.

A media drive 110 is also connected to the input-output interface 105, as needed. A removable medium 111, such as a magnetic disk, an optical disk, a magneto-optical disc, or a semiconductor memory, is loaded as needed, and information is written or read relative to the removable medium 111.

According to such a computer apparatus, data and programs are uploaded or downloaded via the communication by the communicating unit 109. Moreover, data and programs can be exchanged via the removable medium 111.

The CPU 101 that executes processing operations in accordance with the various programs achieves execution of necessary information processing and communication as the blog server 1 or as the user terminal 5.

Note that the information processing device that constitutes the blog server 1 or the user terminal 5 is not limited to a structure constructed by a single computer apparatus as illustrated in FIG. 2, but may employ a structure in which a plurality of computer apparatuses constructs a system. The plurality of computer apparatuses may construct a system via a LAN, etc., or may be placed at remote sites via a VPN, etc., that utilizes the Internet. The plurality of information processing devices may include a group of servers (cloud) that is available by cloud computing service.

2. Blog Server and Database

Figure 3:
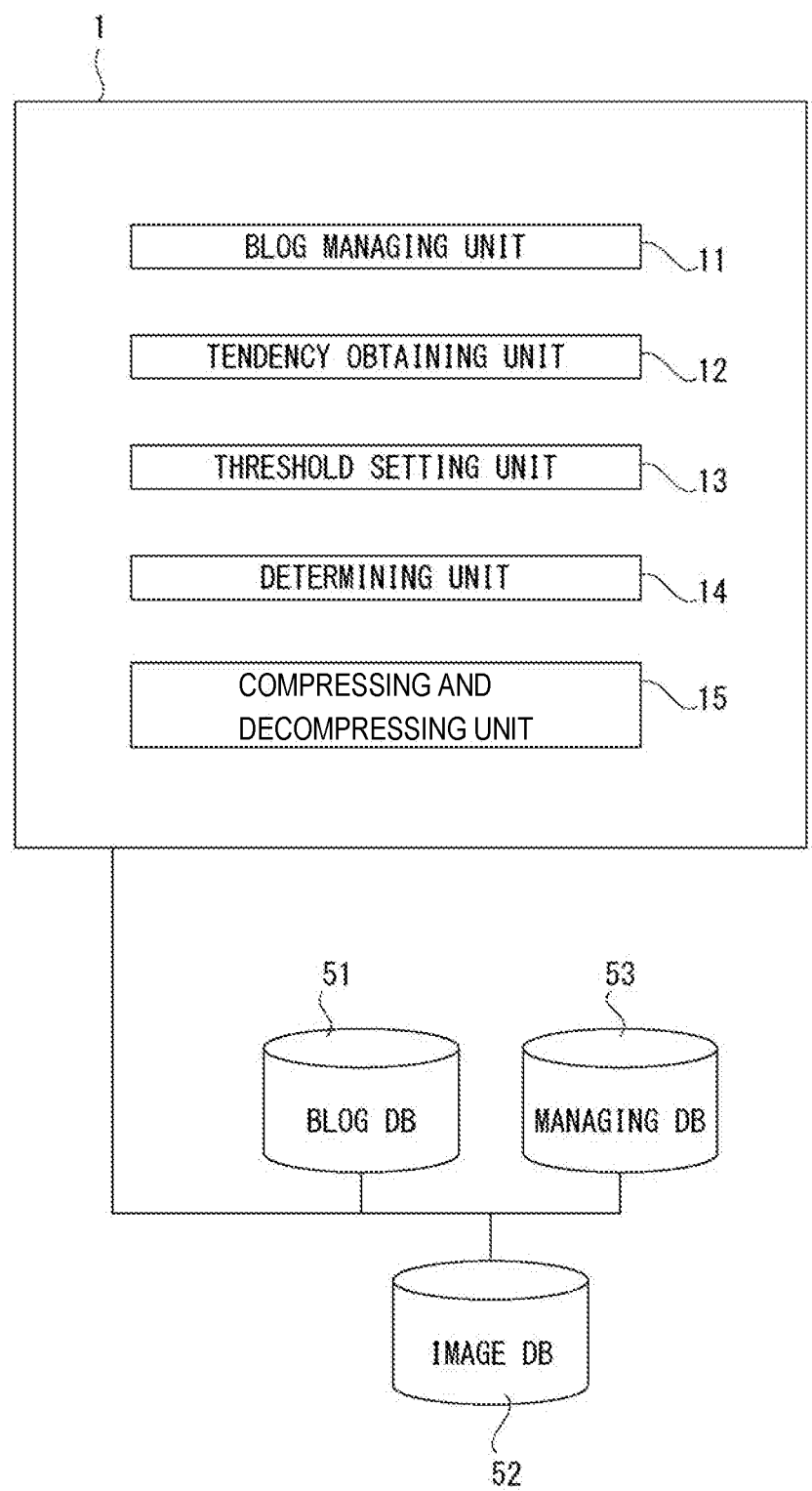
FIG. 3 is an explanatory diagram for a functional configuration of the blog server according to the embodiment.

FIG. 3 illustrates a functional configuration of the blog server 1 constructed by the one or plurality of information processing devices, and various kinds of DBs.

Each function as the blog server 1 is achieved by the process executed by the CPU 101 in the information processing device in accordance with the program. However, all of or a part of a process by each structure to be described below may be achieved by hardware.

Moreover, when each function is achieved by a software, it is unnecessary that each function is achieved by individual program. A single program may execute a plurality of functional processes, or a single function may be achieved by a cooperative operation by a plurality of program modules.

Moreover, each function may be distributed to the plurality of information processing devices. Furthermore, a single function may be achieved by the plurality of information processing devices.

As illustrated in the figure, the blog server 1 includes functions as a blog managing unit 11, a tendency obtaining unit 12, a threshold setting unit 13, a determining unit 14, and a compressing and decompressing unit 15.

The blog managing unit 11 executes necessary processes as a server that provides the blog service. For example, this unit provides the blog environment to the user, manages information on the user as the describer, stores and manages the created blog, manages information on each blog, and distributes the webpage of the blog (article) in accordance with the access request, and the like.

The blog managing unit 11 sets an upper limit value of a total data amount permitted for each blog (a total-data-amount upper limit value below). The total-data-amount upper limit value may be uniform and same data amount for all blogs like 2 Giga Byte (GB), or may be a different data amount for each blog in order to permit a larger data capacity for a popular blog, etc.

Moreover, the blog managing unit 11 updates and reads the information in the managing DB 53 as needed.

The tendency obtaining unit 12 obtains a value that indicates an increasing tendency or decreasing tendency of the total data amount of the blog. Regarding the obtainment of the value, a value that has been already calculated may be obtained from DB etc., or a value which indicates a tendency and which is calculated from a plurality of values may be obtained. Note that it is unnecessary for the value that indicates a tendency to be a numeric value, and the value that indicates a plurality of degrees, such as "high (increasing tendency high)/middle (increasing tendency middle)/low (increasing tendency low), is also applicable. In the following description, the value that indicates the increasing tendency or the decreasing tendency of the total data amount of the blog will be collectively referred to as an "increasing tendency index".

The increasing tendency index is obtained for each blog and is desirably derived from the total data amount of all the articles contained in the blog, but this is merely an example. For example, the increasing tendency index may be obtained by estimating the total data amount of the entire blog from the increasing tendency of the number of posted articles.

In addition, the tendency obtaining unit 12 obtains a value that indicates an accessibility to the article (an accessibility index below).

The accessibility index to the article is obtained using information to be adopted as the accessibility index from, for example, a number of page views for the article, a number of accessed unique users, a total linked number, a value that indicates a ranking of the article, a length of a time period at which there is no access request to the article, a number of page views for the article within a predetermined time period, a value that indicates the increasing tendency of the page view for the article, and a number of clicks on an advertisement provided in an article page. More specifically, one of these values may be selected and obtained as the accessibility index, or the accessibility index calculated from plural pieces of information may be obtained.

Furthermore, the tendency obtaining unit 12 obtains a value that indicates a popularity tendency of the blog (a popularity degree index). The popularity degree index of the blog is calculated based on one or a plurality of the following values: the total number of page views for the entire blog, the number of page views for each article, the number of unique users who have accessed the blog, the total linked number set for the blog, the total number of comments posted on the blog, the number of unique users who have posted the comments on the blog, the value that indicates the page ranking of the blog, the length of a time period at which there is no access request to the blog, the total number of page views for the entire blog within a predetermined time period, the value that indicates the increasing tendency of the page views for the entire blog, the value that indicates the blog update frequency (an article posting frequency), the number of clicks to an advertisement provided on a blog page, and the value that indicates the increasing tendency of the data amount for the entire blog, etc.

The threshold setting unit 13 executes a process of setting a threshold for a determination on whether or not to compress the data capacity of the blog (a blog compression determination threshold below) for each blog.

Regarding the setting of the threshold, the increasing tendency index obtained by the tendency obtaining unit 12 is applied. The higher the increasing tendency index is (i.e., the increasing speed of the total data amount of the blog is fast), the lower the threshold is set for the blog. This prevents an excess of the total-data-amount upper limit value, thereby preventing a limitation to positing of a new article.

The determining unit 14 executes a process of determining whether or not to compress the article contained in the blog based on the blog compression determination threshold. In other words, a process of determining whether or not the blog is the blog to be compressed. The determining unit 14 also determines which article is to be compressed among the articles when determining that the blog is to be compressed.

Moreover, the determining unit 14 executes a process of determining whether or not to decompress based on the contents of the article, a process of determining whether or not to decompress the article based on the accessibility index of the article, etc.

A specific example will be described later as a process in each embodiment.

The compressing and decompressing unit 15 executes a process of compressing the article determined as to be compressed by the determining unit 14.

Moreover, the compressing and decompressing unit 15 executes aa decompressing process to the compression when the access request is made to the already-compressed article.

Furthermore, the compressing and decompressing unit 15 executes a process of decompressing the already-compressed article determined as to be decompressed by the determining unit 14.

Upon the execution of the compressing process on the article, the blog that does not need a further compressing process on the article is no longer the blog to be compressed.

FIG. 3 illustrates the blog DB 51, the image DB 52, and the managing DB 53 that are DBs to which the blog server 1 accesses.

The blog DB 51 stores the blog data for each describer as webpage data. Regarding each blog, the article is added in accordance with the describer's posting.

The data on the webpage that forms the blog is structured document files, such as HyperText Markup Language (HTML) and Extensible HyperText Markup Language (XHTML). Described in the structured document files are text data for the article posted by the describer, specifying information for image data on various images, the layout thereof, and the display scheme thereof (e.g., a letter color, a font, a size, and a decoration).

Moreover, the audience can also post a comment to the blog. Data on such a comment from such an audience is also stored in the blog DB 51 in association with the blog and each article therein.

When there is the access request to a certain blog from the user terminal 5, the blog server 1 reads the requested blog page from the blog DB 51, and distributes the read information to the user terminal 5.

The image DB 52 stores the image data (still image data or motion image data) attached to the blog.

Although an image can be attached to the article in the blog, for example, article data and specifying information (link information) on the image corresponding to the article data are stored in the blog DB 51. Moreover, the image data itself is stored in the image DB 52. In the case of the access request to the blog article to which the image is attached, the webpage data is displayed by the browser on the user terminal 5, but at this time, the user terminal 5 requests the image data to the blog server 1 in accordance with the link setting on the webpage. The blog server 1 reads image data from the image DB 52 in accordance with the request, and distributes the image data to the user terminal 5. Hence, a blog article with the image is displayed on the user terminal 5.

Note that this is merely an example, and the webpage data that contains the image data in advance may be stored in the blog DB 51.

The managing DB 53 stores information for managing each blog.

An example of the details of managing DB 53 will be illustrated in FIG. 4.

A blog Identification (ID) is set for each blog, and the accompanying information is managed based on the blog ID. For example, user information, blog managing information, blog actual-achievement information, size information, determination information, compression and decompression information, a compressed article tag, etc., are updated and managed as needed for each blog (the blog ID).

The user information is information on the user (blog operator) as the describer who has launched the blog. For example, user information includes a user ID, a login password as the operator, attribute information such as a user's address, a name and age, and information on a login date and time as the operator.

The blog managing information is the attribute information on the blog itself. For example, such information contains the Uniform Resource Locator (URL) of the blog, genre information on the blog, the blog launched date and time, the number of articles in the blog, update date and time information, layout information on the blog, and link setting information.

Regarding the blog actual-achievement information, information that becomes the increasing tendency index of the blog, information that becomes the popularity degree index of the blog, and information that indicates an index for the accessibility to each article are stored.

More specifically, regarding the entire blog, the total number of page views, the number of accessed unique users, the total linked number, the value that indicates the page ranking of the blog, the length of a time period at which there is no access request to the blog, the total number of page views for the entire blog within a predetermined time period, the value that indicates the increasing tendency of the page view for the entire blog, the value that indicates the blog update frequency, and the number of clicks on the advertisement provided on the blog page, are stored and updated as needed.

Since these values become respective values in accordance with the popularity degree for each blog, those values are suitable for calculating the popularity degree index. Note that the calculated popularity degree index is also stored as the blog actual-achievement information.

The calculated increasing tendency index of the blog is also stored as the blog actual-achievement information.

Moreover, as the blog actual-achievement information for each article, the number of page views, the number of accessed unique users, the total linked number, the value that indicates the ranking of the article, the length of the time period at which there is no access request to the article, the number of page views for the article within a predetermined time period, the value that indicates the increasing tendency of the page view for the article, and the number of clicks to the advertisement provided on the article page, are stored and updated as needed.

Since these values become respective values in accordance with the accessibility for each article, those values are suitable for calculating the degree of accessibility (the accessibility index below). Note that the calculated accessibility index is also stored as the blog actual-achievement information.

The size information is information on the total data amount of the articles contained in the entire blog. Moreover, the size information on each article may be stored. The size information is updated in accordance with the update of the blog.

Note that the data amount stored in the blog DB 51 as the size information and the data amount of the image data stored in the image DB 52 may be collectively managed, or may be separately and individually managed.

The determination information is determination information on whether or not to set the blog as the blog to be compressed, and information on the determination for each article by the determining unit 14 for whether or not to compress based on the increasing tendency index, the popularity degree index, and other information. Moreover, information on the determination by the determining unit 14 for whether or not to decompress the compressed article is also included. That is, the determination information indicates whether or not to compress or whether or not to decompress. These pieces of information are updated as, for example, flag data.

The article that has stored information as information which is on whether or not to compress and which indicates to compress is the article subjected to the compressing process. Moreover, after the compressing process, the flag data is cleared, and information that indicates not to compress (i.e., a status not subjected to the compressing process) is overwritten.

In addition, the blog compression determination threshold is stored as the determination information.

The compression and decompression information indicates, for each article in the blog, in which status the data is stored at this time point, such as original status, compressed status, or decompressed status from the compression. It is appropriate if the compression and decompression information is defined as status information to identify the status.

Moreover, the execution date and time of the compression or the decompression is also stored as past-record information on the compression or the decompression.

In the following description, the article in the original status will be referred to as the "uncompressed article", the article in the compressed status will be referred to as the "compressed article", and the article in the decompressed status from the compression will be referred to as the "decompressed article".

Note that the data on the decompressed article may be the same as the data on the uncompressed article, but since lossy compression is applied, the decompressed data may have a lower data quality than the original article data. That is, the data on the uncompressed article and the data on the decompressed article are not always exactly the same data. Hence, in order to distinguish the decompressed article data after the compression from the "uncompressed article", such an article will be referred to as the "decompressed article".

A compressed article tag is set in accordance with the contents for each article.

For example, a phrase like a keyword that appears in the article, a current-news phrase, and a genre of the article are set and registered as the tag. For example, when the compression is executed, the tag in accordance with the contents of the article is created, and is registered as the compressed article tag. The compressed article tag is utilized to estimate the contents in the compressed article without a decompression.

Each of the above-described DBs (the blog DB 51, the image DB 52, and managing DB 53) may be achieved in any form as long as the blog server 1 is accessible. For example, all of each DB may be formed in a storing unit within the same system as the blog server 1, or a part of or all of the respective DBs may be separately formed and provided in a computer system, for example, at a remote site. Needless to say, it is unnecessary that each DB is formed within the single device (e.g., a single HDD). Moreover, it is unnecessary that each DB is constructed as the single DB. For example, information stored as the managing DB 53 may be stored and managed by a plurality of DBs (e.g., a DB for managing a user relating to a blog, and a DB for managing the blog). Each of the above-described DBs are merely presented as an example in which the storing unit for the information relating to the process in the embodiment is constructed in the form of a single DB.

3. First Embodiment

An example process as a first embodiment which is executed by the blog server 1 will be described.

Presently, although a blog can be easily started by general users, there is a user who loses the interest after uploading several articles, or there is a user who maintains the interest for a long time. Moreover, there is a popular blog with many access requests, and there is a blog that has almost no audience.

It is necessary for the blog server 1 to maintain the blogs for those various users without prejudice, but because of this reason, the storage resource load is likely to become large. Accordingly, the total-data-amount upper limit value is set for each user, and blog posting is received and managed within the permitted storage resource. Moreover, regarding the blog coming close to the total-data-amount upper limit value, by compressing an appropriate article, the storage resource is ensured. However, it is important to appropriately determine whether or not to compress for each user.

Hence, according to this embodiment, the blog server 1 decides a blog and an article to be compressed based on the increasing tendency index for each blog. Moreover, when there is an access request to the compressed article, the article is decompressed and distributed.

However, since the compressing process and the decompressing process also need a certain process load, it is desirable not to execute such processes so frequently. Moreover, decompression of the compressed article and distribution of such an article increase a response time together with the process load, and thus there is a possibility such that the user feels a reduction in performance. Hence, it is desirable to avoid an access request to the compressed article as much as possible.

Hence, according to this embodiment, the article that has a low accessibility is appropriately selected among the articles belonging to the blog to be compressed, and is set as the article to be compressed.

Figure 5:
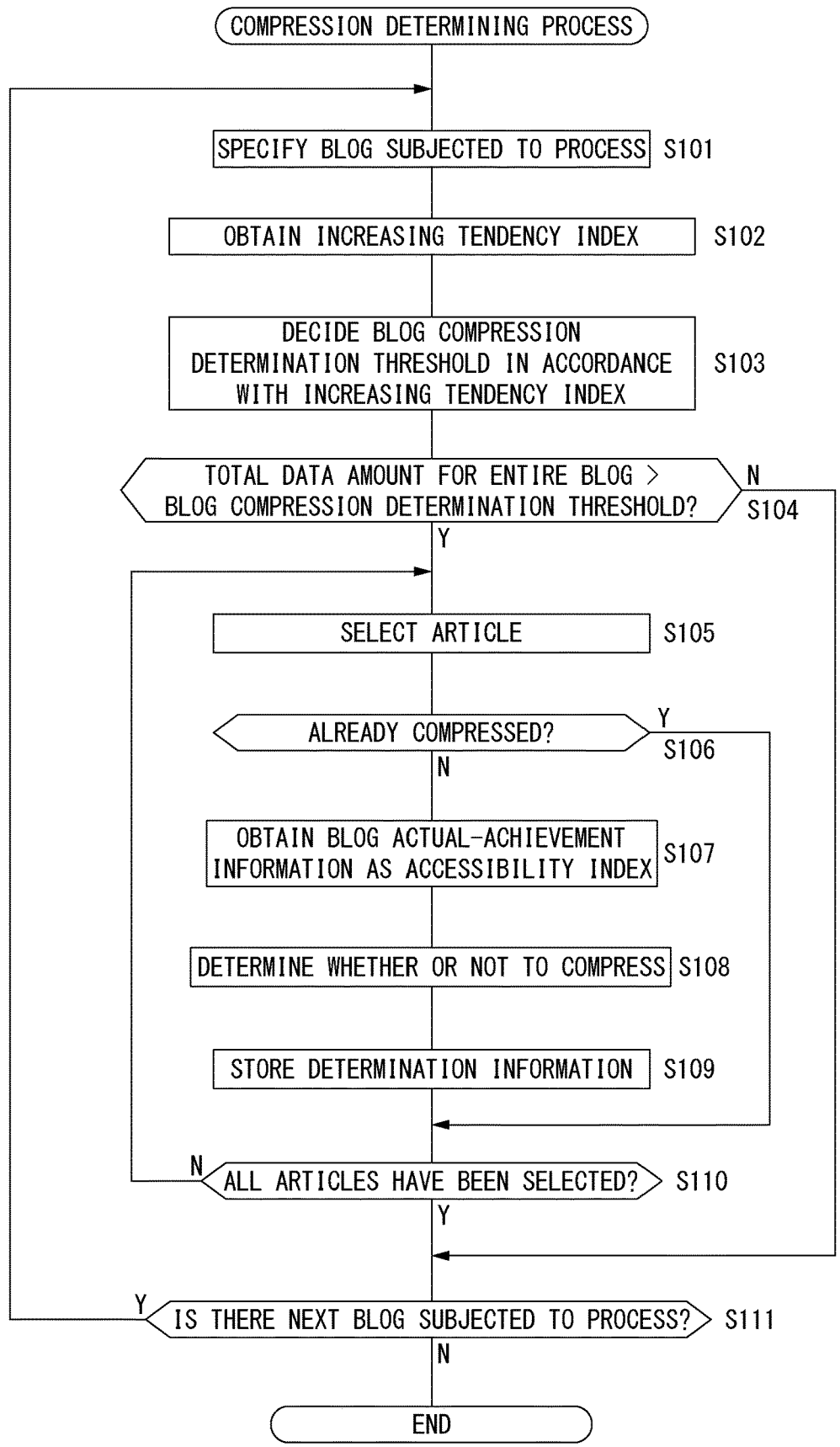
FIG. 5 is a flowchart of a compression determining process according to a first embodiment.

FIG. 5 illustrates an example compression determining process executed by the blog server 1. According to the compression determining process, the blog to be compressed is determined, and the article to be compressed is determined among the articles contained in the blog to be compressed.

Note that according to this example, the increasing tendency index that is stored as the blog actual-achievement information is obtained. An example scheme of calculating the increasing tendency index will be described later. Moreover, regarding the accessibility index for each article, a value in the blog actual-achievement information is directly utilized as the accessibility index.

Respective processes illustrated by the flowcharts from FIG. 5 and up to FIG. 18 to be described later are processes executed by the functions of the blog server 1 which are the blog managing unit 11, the tendency obtaining unit 12, the threshold setting unit 13, the determining unit 14, and the compressing and decompressing unit 15 as illustrated in FIG. 3.

The blog server 1 executes the compression determining process in FIG. 5 as needed on all of or some blogs stored in the blog DB 51. This is a process of determining the blog subjected to the compression at this time as the blog to be compressed, and of determining which article among the articles contained in this blog is set as the article to be compressed.

First, the blog server 1 specifies, in step S101, one blog subjected to the compression determining process. For example, one blog may be selected in accordance with the sequence of the blog IDs.

The blog server 1 obtains, in step S102, the increasing tendency index for the blog that is specified as the blog subjected to the process. In this example, the increasing tendency index stored in the managing DB 53 as the blog actual-achievement information is obtained.

Note that since the increasing tendency index relatively indicates how fast the storage capacity increases in comparison with other blogs, it is not preferable to obtain a value calculated by a different scheme for each blog. That is, when an average value of the storage capacity which increases per a day is calculated and is applied as the increasing tendency index, it is desirable to obtain the increasing tendency index that is calculated by the same scheme for all the blogs.

Next, the blog server 1 executes, in step S103, a process of deciding the blog compression determination threshold in accordance with an increasing tendency index.

When, for example, the total data amount of the blog allocated to the describer per a person is 2 GB, the blog compression determination threshold is set to be a smaller value than 2 GB. As an example, the threshold is decided like 1.9 GB/1.95 GB/1.98 GB based on high/middle/low of the increasing tendency index.

An example in which the increasing tendency index is classified into high/middle/low will be described.

For example, the average value of the storage capacity that increases per a day (an increasing capacity average value below) is adopted as the increasing tendency index, and:

when the increasing capacity average value is 0 to 50 Kilo Byte (KB)=the increasing tendency index (increasing speed) is low (slow);

when the increasing capacity average value is 50 KB to 300 KB=the increasing tendency index is middle; and when the increasing capacity average value is equal to or greater than 300 KB=the increasing tendency index (increasing speed) is high (fast).

In this case, as for the blog that has the increasing capacity average value which is 100 KB, the increasing tendency index is determined as middle, and the blog compression determination threshold is set to be 1.95 GB.

Note that the blog compression determination threshold that is classified into three classes in accordance with the increasing tendency index is merely an example, and such a threshold may be classified into two classes or may be classified into equal to or greater than four classes.

As an example in which the blog compression determination threshold is classified into equal to or greater than four classes, an example in which a formula is utilized will be described.

When, for example, the maximum value of the increasing capacity average value among all the blogs is 400 KB, and when the increasing capacity average value of the blog subjected to the process at this time is 200 KB, a calculation may be made such that the blog compression determination threshold=1.98 GB—(200 KB/400 KB×0.08 GB)=1.94 GB. According to this formula, the blog compression determination threshold of the blog that has the increasing capacity average value=400 KB is set to be 1.9 GB, and the blog compression determination threshold of the blog that has the increasing capacity average value=0 KB is set to be 1.98 GB. That is, the blog compression determination threshold is finely set in accordance with the increasing tendency index. Note that in this case, it is unnecessary to classify the increasing tendency index into three classes that are high/middle/low, etc.

In addition, the blog compression determination threshold may be calculated in consideration of the distribution of the increasing tendency indexes of all the blogs, or may be calculated by utilizing the increasing tendency index of the blog subjected to the process only.

Subsequently, the blog server 1 executes, in step S104, a process of determining whether or not the total data amount of the blog subjected to the process exceeds the blog compression determination threshold.

When the total data amount of the blog does not exceed the blog compression determination threshold, the blog server 1 transitions the process to step S111 to be described later.

In contrast, when the total data amount of the blog exceeds the blog compression determination threshold, the blog server 1 determines that the blog subjected to the process is the blog to be compressed, stores the determination result as the determination information in the managing DB 53, and then executes respective processes in steps S105 to S110 so as to determine whether or not to compress each article in the blog.

The blog server 1 selects, in step S105, one article in the blog.

The blog server 1 checks, in step S106, whether or not the selected article has been already compressed. This can be carried out by, referring to, for example, the compression and decompression information in the managing DB 53.

When the article has been already compressed, since the determination on whether or not to compress this article is unnecessary, the process progresses to step S110, and it is checked, in the step S110, whether or not the process has been completed on all the articles, and when the process has not completed yet, the process returns to the step S105 and selects the next article.

Note that all the articles in the step S110 mean all the articles subjected to the process at this time. It may be all the articles in the blog, or may be some articles (e.g., the article posted in a specific time period) in the blog.

When the article selected as the article subjected to the process in the step S105 is the article that has not been compressed yet, the blog server 1 progresses the process to the step S107 from the step S106, and obtains the blog actual-achievement information that is the accessibility index for this article. The obtainment of the accessibility index in this example is a process of obtaining a piece of information adopted as the accessibility index from the information stored in the managing DB 53 as the blog actual-achievement information. More specifically, a piece of information to be adopted as the accessibility index is selected and obtained among the number of page views for the article, the number of accessed unique users, the total linked number, the value that indicates the ranking of the article, the length of a time period at which there is no access request to the article, the number of page views for the article within a predetermined time period, the value that indicates an increasing tendency of the page views for the article, and the number of clicks to the advertisement provided on the article page, etc., all stored in the managing DB 53.

Note that regarding the accessibility index, it is desirable to obtain the same index for each article.

Subsequently, the blog server 1 determines, in the step S108, whether or not to compress the article based on the accessibility index. That is, when the accessibility is high, the article is determined as not to be compressed, and when the accessibility is low, the article is determined as the article that can be compressed (or as the article that should be compressed).

When, for example, the length of a time period at which there is no access request to the article is selected as the accessibility index, a determination is made on whether or not such a time period is equal to or longer than three years, and the article that has no access request for equal to or longer than three years is determined as the article to be compressed due to the low accessibility. Note that the value three years (a threshold for the determination) is merely an example. This value may be changed for each describer, and may be the uniform and same value. When the value is changed for each describer, it is desirable to decide in view of the distribution of the accessibility indexes of the respective articles belonging to the blog subjected to the process. That is, in the case of the blog that has many articles which have the low accessibility indexes, the above threshold for the determination "three years" may be extended to "five years". Moreover, in the case of the blog that has many articles which have the high accessibility indexes, the above threshold for the determination "three years" may be shortened to "one year".

As described above, after the blog to be compressed is determined in consideration of the increasing tendency index of the blog in the steps S103 and S104, the determination on whether or not to compress is made in the steps S107 and S108 in consideration of the accessibility index.

This enables a determination on whether or not to compress the article that is not accessed frequently in consideration of the increasing tendency of the storage resource for the blog.

For example, with a time period at which there is no access to the article at all like "the time period at which there is no access to the article continues for equal to or longer than three years" being as an index value, the article that has the index value which satisfies a certain condition may be compressed. In this case, however, it is not always true that the accessibility is properly determined.

When, for example, the blog that has a small increasing storage capacity is determined as the blog to be compressed like the blog that has a high increasing storage capacity, the article is to be compressed although the necessity for compression is still low. In this case, a possibility such that the article to which an access request is made has been already compressed increases, and thus opportunities for compression and decompression increase. Therefore, in view of a desire to reduce the opportunity of compression and decompression as much as possible, a determination regarding the blog to be compressed and regardless of the increasing storage capacity is not always appropriate.

Accordingly, the blog server 1 utilizes, in the step S104, the blog compression determination threshold on which the increasing tendency index of the blog is reflected. This causes the blog that has a low increasing tendency for the occupying storage capacity to be not likely to be selected as the blog to be compressed.

In subsequent step S109, the blog server 1 stores the determination result on whether or not to compress the article as the determination information. For example, the flag which indicates compression or not compression and which is stored in the managing DB 53 as the determination information for the article is updated or maintained.

When the determination on whether or not to compress one article completes through the above procedures, the blog server 1 checks, in the step S110, whether or not the determination has completed for all the articles subjected to the process at this time in the blog subjected to the process presently, and when not completed yet, the process returns to the step S105, and the next article is selected. Subsequently, the steps S106 to S109 are executed.

When the determination on whether or not to compress has completed for all the article subjected to the process at this time in a certain blog, it is checked, in step S111, whether or not to subsequently execute the process on the other blog. When the similar process is executed on the other blog, the process returns to the step S101, the other blog is specified as the blog subjected to the process, and then the similar process is executed.

When, for example, the process has been completed for all the blogs subjected to the process at this time, the compression determining process in FIG. 5 is terminated from the step S111.

The blog server 1 executes such a compression determining process as illustrated in this FIG. 5 as needed. For example, the process may be executed for all the blogs stored in the blog DB 51 periodically. This causes each blog to be determined whether or not each article should be compressed, and the determination information is stored in the managing DB 53.

Note that it is desirable for each blog to execute the compression determining process as illustrated in FIG. 5 not only once at a certain time but also repeatedly for a certain time period. This is because it is expected that the increasing tendency index of the blog changes time period by time period.

Figure 6:
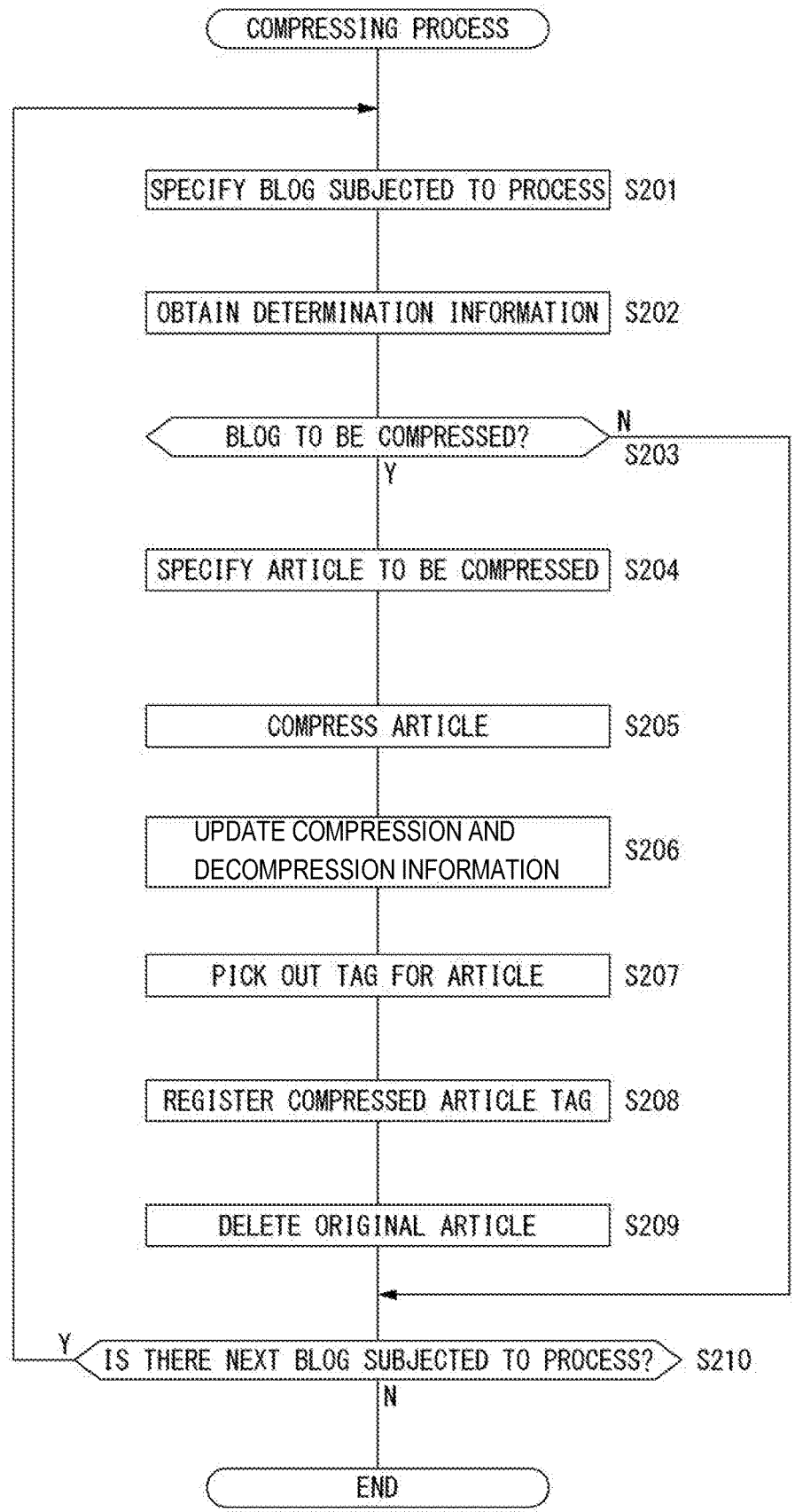
FIG. 6 is a flowchart of a compressing process according to the first embodiment.

The blog server 1 executes the above compression determining process as appropriate, and executes the compressing processes illustrated in FIG. 6 as appropriate. For example, the compressing process is periodically executed for all or some blogs.

As the compressing process illustrated in FIG. 6, first, the blog server 1 specifies, in step S201, one blog subjected to the process.

The blog server 1 obtains, in step S202, the determination information on the blog specified as being subjected to the process. That is, this is the determination information stored in the managing DB 53 in association with the blog ID of this blog. More specifically, this is a process of checking, for example, information indicating whether or not the blog is the blog to be compressed and determined in the compression determining process in FIG. 5, and the flag information that indicates whether or not to compress for each article.

The determination information enables to check whether or not the blog is the blog to be compressed, and whether or not each article in this blog is the article to be compressed.

Accordingly, the blog server 1 determines, in step S203, whether or not the blog subjected to the process is the blog to be compressed.

When the blog subjected to the process is not the blog to be compressed, the blog server 1 progresses the process from the step S203 to step S210, and completes the compressing process on this blog. Next, it is also checked whether or not to execute the compressing process for the other blogs. When the compressing process is executed on the other blog, the process returns to the step S201, and the other one blog is specified as the blog subjected to the process.

When there is equal to or greater than one article to be compressed, the blog server 1 progresses the process from the step S203 to step S204, and specifies the article to be compressed among the articles belonging to the blog to be compressed. When the plurality of articles is the articles to be compressed, all the articles to be compressed are specified.

Subsequently, the blog server 1 compresses the article in the step S205. That is, the data on the one or the plurality of articles specified in the step S204 is compressed. Next, the article that becomes the compressed data is stored in the blog DB 51 and the image DB 52 in association with the blog.

What compression is to be executed in the step S205 may vary.

First, as the setting for the part to be compressed, i.e., as the kind for which part in the article data is to be compressed, the followings are considerable.

Both the text data and the image data in the article are compressed.

All the text data in the article is compressed.

A part of the text data in the article is compressed.

All the image data in the article is compressed.

A part of the image data in the article is compressed.

According to the compression on both the text data and the image data in the article, a compression effect is enhanced, and thus a reduction effect of a necessary storage capacity is enhanced.

According to the compression on all the text data in the article, depending on the text data amount and a compression percentage, the compression effect (the capacity reduction effect) is enhanced. In particular, this is effective for the blog that has the article contents which are mainly text data.

According to the compression on the part of the text data, a response and a distribution if an access is made after the compression are prompt. For example, a predetermined part in the header of the blog (the part not appear in a first view at the time of viewing) is compressed. It is expected that the compressed part is decompressed and distributed as will be described later, but since the first view part is not compressed, the data can be promptly (without a decompressing process) distributed to the user terminal 5. Moreover, when the subsequent part is decompressed and distributed while the first view is being displayed on the user terminal 5, the audience feels as if there is no delay in response.

Moreover, the compression on only the text data has advantages such that a process load is little in comparison with a case in which the image data is compressed, and the process time is short.

According to the compression on all the image data in the article, since the part that has a large data amount is compressed, the compression effect (the capacity reduction effect) is enhanced. Regarding the compression on the image data, when the compression that decreases the resolution of the image is executed, the capacity reduction effect is particularly high. When there are multiple pieces of the image data, the compression may be executed on not all the image data but some pieces of the image data.

When some pieces of the image data in the article are compressed, it is appropriate if the image that does not appear in the first view at the time of viewing should be selected and compressed. In that case, when an access is made after the compression, it is appropriate if the image data that does not need a decompression should be distributed first. Hence, the audience feels as if there is no delay in response. Next, the subsequent image data may be decompressed and distributed while the first view is being displayed on the user terminal 5.

The above setting for the part to be compressed in the article may be fixed, or may be changed in accordance with a status. For example, an automatic selection may be permitted in accordance with the storage resource status of the blog DB 51 and that of the image DB 52, etc.

When, for example, the resource of the blog DB 51 which can record becomes equal to or lower than a predetermined quantity, the compression on the text data is selected, and when the resource of the image DB 52 which can record becomes equal to or lower than a predetermined quantity, the compression on the image data is selected. When the storable capacities of both the blog DB 51 and the image DB 52 decrease, both the text data and the image data are compressed, etc. As an example, this can be achieved by setting the blog compression determination threshold for text data and the blog compression determination threshold for image data.

Moreover, the setting for the part to be compressed may be automatically selected for each blog and for each article.

An example of deciding the compressing process details in accordance with the contents of the article is as follows.

When the text data in the article is equal to or larger than a predetermined amount, only the text data is compressed, and when less than the predetermined amount, the text data and the image data are entirely compressed.

When the image data is contained in the article, only the image data is compressed.

Furthermore, as an example of selecting the part to be compressed for each blog, a determination is made on whether the blog is mainly a text blog or is mainly an image blog in accordance with a ratio between the text and the image in the entire blog. In the case of the mainly text blog, the text data may be compressed, and in the case of the mainly image blog, the image data may be compressed.

Conversely, when a priority is given to the distribution speed to be felt by the user when an access is made, in the case of the mainly text blog, the image data may be compressed, and in the case of the mainly image blog, the text data may be compressed.

Note that when a motion image is contained as the image data, compression on both the motion image and the sound data, or either one may be selected.

In addition to the above-described setting for a part to be compressed, a setting for a compression scheme is also broadly considerable. Various schemes are well known for compression on the image data and on the text data, and the compression percentage is selectable variously. Selection can be also made for lossless compression or for lossy compression.

Regarding to this compression scheme, a certain compression scheme may be fixedly applied, or may be selected in accordance with a status.

When, for example, the resource of the blog DB 51 or that of the image DB 52 which can record becomes equal to or lower than a predetermined amount, the compression scheme may be changed to a compression scheme that has a higher compression percentage.

Moreover, the compression scheme may be automatically selected for each blog and for each article.

For example, the higher the increasing tendency index of the blog is, the higher the compression percentage is set, or the compression scheme that has a different compression percentage is selected in accordance with the low accessibility to the article, and the like.

After executing, in the step S205 in FIG. 6, the compressing process on the one or the plurality of articles to be compressed in the blog subjected to the process presently, the blog server 1 updates (from compression permitted to compression unpermitted) the information (flag information) that indicates whether or not to compress the article subjected to the compression process.

Subsequently, the blog server 1 updates, in step S206, the compression and decompression information in the managing DB 53. In this case, for example, the flag information is updated so as to indicate that the compressed article in the blog is in the compressed status. Moreover, a compression past-record is also added.

The blog server 1 sets, in step S207, the tag for each compressed article. The tag in this case is information that indicates a keyword reflecting the contents of the article and genre information of the article, and is utilizable for searching and pick-out of the article.

Compression of the article results in a difficulty in text searching for the article. That is, when it is desirable to also put the compressed article in a search range, it is necessary to take a time for executing the decompression at the time of searching. Hence, the tag is set and registered in advance.

When the process in the step S207 is being executed, regarding the article subjected to the process, both the compressed article and the original article before the compression (i.e., the uncompressed article) are stored.

Accordingly, in the step S207, the blog server 1 picks out a frequently appearing word, picks out a noun by morphological analysis, obtains the genre information, etc., from the data on the uncompressed article, and sets one or the plurality of phrases to be registered as the tags.

Next, the blog server 1 registers, in step S208, such a tag as a compressed article tag in the managing DB 53. That is, one or the plurality of phrases like a keyword is registered in association with each of the compressed articles.

Note that the setting and registration of the compressed article tag are executed on a given article in the example illustrated in FIG. 6 when this article is compressed, but may be executed on all the articles in advance. In particular, the tag is applied for the article search, and if the tags are registered in advance for all the articles, such a tag is applicable as the compressed article tag in this embodiment. Hence, it is unnecessary to execute the steps S207 and S208.

In the case of, however, a system that does not particularly register the tags for all the articles, by registering the compressed article tags in the steps S207 and S208 as illustrated in FIG. 6, the process becomes a minimum-requisite process for the necessary article. Hence, this is advantageous for preventing a process load on the blog server 1 from increasing.

The blog server 1 deletes, in step S209, the data on the original article before the compression for the compressed article. Needless to say, when only a part of the article is compressed, the original data on the compressed part only is deleted. Moreover, when the process of compressing again the decompressed article is executed, the decompressed article that is the original data on the article before the compression is deleted.

When the compressing process has been completed for one blog through the above processes, the blog server 1 checks, in step S210, whether or not there is other blog subjected to the process.

When the process for all the blogs subjected to the process at this time has been completed, the compressing process in FIG. 6 is terminated from the step S210.

By executing the above compressing process in FIG. 6, the actual compressing process is executed on the article determined as compression permitted by the compression determining process in FIG. 5, and the recovery of the storage resource is achieved.

Subsequently, the process of the blog server 1 when there is an access request to the blog or the article therein will be described with reference to FIGS. 7 and 8.

The blog server 1 that confirms, in step S301, the receipt of the access request from the user terminal 5, determines, in subsequent step S302, whether or not the requested article is the compressed article.

When the article is not the compressed article, the blog server 1 progresses the process from the step S302 to step S303, and distributes the requested article in a normal scheme. That is, the webpage data on the corresponding article is read from the blog DB 51, and is transmitted to the user terminal 5. This enables the audience who is using the user terminal 5 to view the desired article.

When the article to which the access request is made is the compressed article, the blog server 1 progresses the process to step S304, and executes the decompressing process. That is, the data in the compressed status on the corresponding article is read from the blog DB 51, and the decompressing process is executed. Next, the webpage data that has been decompressed is transmitted to the user terminal 5 in step S305. Hence, even if the article has been compressed, the audience who is using the user terminal 5 can view the desired article.

Note that when a part of the data on the article, in particular, the data other than the region to be appeared as the first view in the webpage data is compressed as described above, the blog server 1 can first transmit the uncompressed part of the article to the user terminal, execute the decompressing process on the compressed part during such a transmission, and transmit the data that has the decompression completed. This enables a distribution that does not cause the audience to feel the decompressing process time, and thus the service performance of the blog server 1 can be maintained.

Moreover, when, in addition to the compression on the part other than the first view, a part of the article is compressed, it is likewise desirable to first transmit the uncompressed part in the article.

After the compressed article is decompressed and distributed, example processes as illustrated in FIG. 8A, FIG. 8B, and FIG. 8C are considerable.

Figure 7:
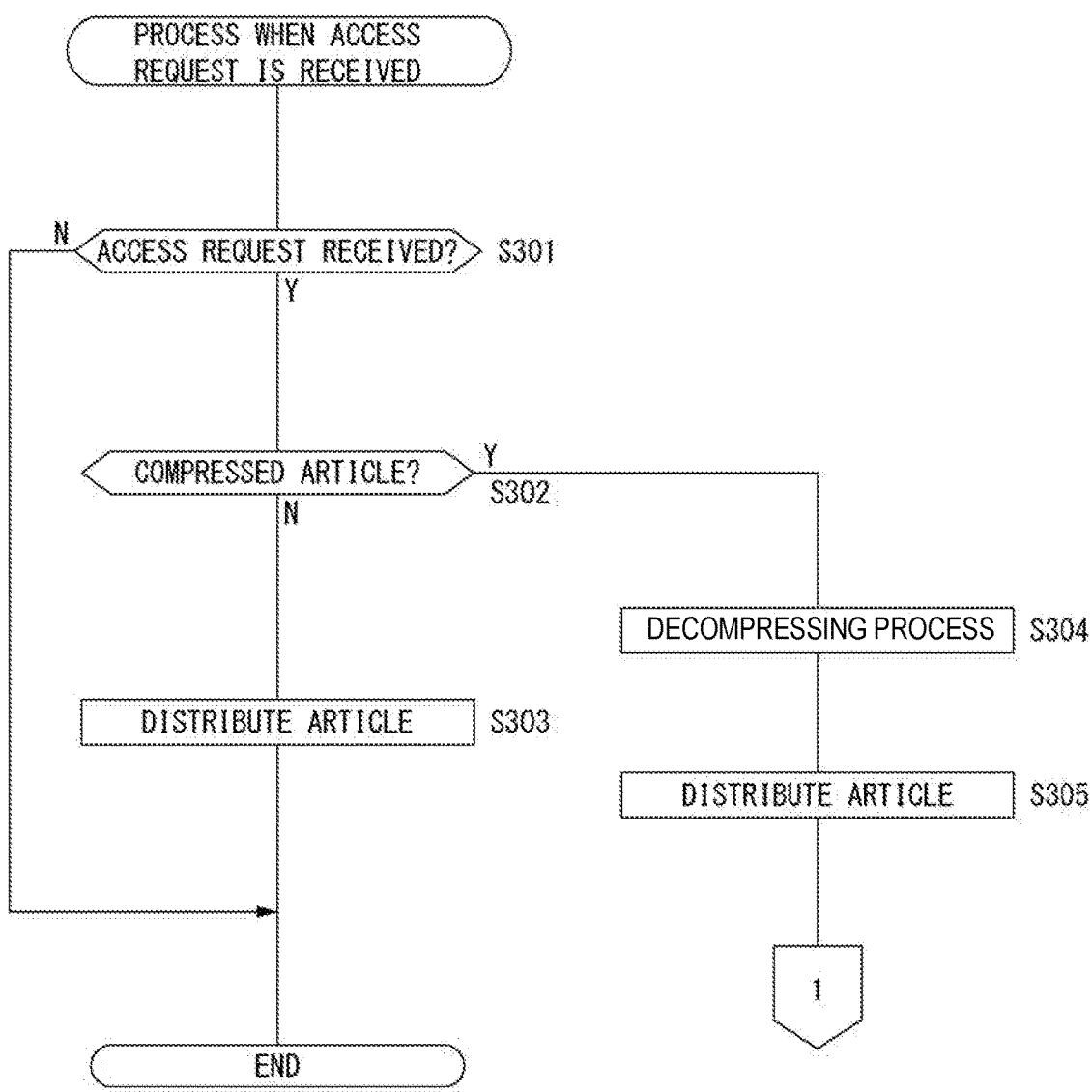
FIG. 7 is a flowchart of a process when an access request is received according to the embodiment.

First, in the example case in which the process progresses to step S310 in FIG. 8A from the step S305 in FIG. 7, the blog server 1 does not store the decompressed article, i.e., the decompressed data on the compressed article, i.e., the distributed webpage data, and deletes such data.

This is based on an assumption that the present access request to such an article is an exceptional access, and this article still has the low accessibility and thus being compressed. Hence, the compressed article is stored as it is.

When a subsequent access occurs, the decompressing process is executed access by access. Although a decompressing process load is produced in accordance with the access request, since it can be considered that the number of accesses is small at all, an advantageous effect in storage resource can be maintained by storing such an article in the compressed status.

In contrast, an occurrence of the access to the compressed article can also be considered such that the accessibility for the compressed article (the article determined as having a low accessibility) may be increasing.

Hence, the example in which the process progresses to the step S320 in FIG. 8B from the step S305 in FIG. 7 is expected. The blog server 1 combines, in the step S320, the decompressed article data in the blog. Next, the compressed article is deleted in step S321. That is, instead of the compressed article combined in the blog so far, the data on the decompressed article (the decompressed article) is combined in the blog.

The blog server 1 updates, in step S322, the compression and decompression information in the managing DB 53. That is, the information is updated in such a way that the corresponding article in the blog is the data on the article in the decompressed status from the compression (i.e., the decompressed article). Moreover, past-record information like the date and time of the decompression is added.

When the decompression is executed as described above, since the compressed article is replaced with the decompressed article, the data on the article can be distributed without a decompression when there is an access request subsequently.

Note that when the number of subsequent accesses to the decompressed article is small and the determination is made in the compression determining process in FIG. 5 that the accessibility is still low, such an article is compressed again by the compressing process in FIG. 6. Hence, when the article is still unpopular, the data on the article is compressed again, and thus there is no large disadvantage in comparison with the process in FIG. 8A in view of maintaining the storage resource.

Moreover, when the compressing process is executed by lossy compression, even if the data on the decompressed article decompressed by the subsequent decompressing process is stored, the occupied storage area (necessary storage capacity) in the blog DB 51 is smaller than a case in which the uncompressed article is stored, thus advantageous.

FIG. 8C illustrates the example in which the decompressed article is stored together with the compressed article. When the process progresses to the step S330 in FIG. 8C from the step S305 in FIG. 7, the blog server 1 registers the decompressed data on the article in association with the blog. However, the compressed article is stored as it is. Next, the blog server 1 updates, in step S331, the compression and decompression information in the managing DB 53. That is, the information is updated so as to indicate that there is the decompressed article for the corresponding article in the blog. Moreover, the past-record information like the decompression date and time is added.

In this case, by storing the decompressed article, the data on the article can be distributed without the decompressing process when an access request is made subsequently.

However, by storing both the decompressed article and the compressed article, a load on the storage resource increases. Hence, for example, the decompressed article may be deleted after a certain time period has elapsed. This achieves a circumstance enabling a distribution without the decompressing process when an access is made again for a certain time period when there is the access request.

Moreover, when the compressed article and the decompressed article are both stored in this way, and when the article becomes the article to be compressed by the subsequent process in FIG. 5, in the compressing process in FIG. 6, a process of deleting the decompressed article may be executed.

4. Second Embodiment

In view of the securement of the storage resource, it is preferable to apply lossy compression that has a high compression percentage when an image or a motion image, etc., is to be compressed. However, from the standpoint of viewing the article, the image, etc., do not completely return to the original status at the time of decompression. Hence, it may become difficult to view a clear image, etc.

Hence, according to this embodiment, lossless compression and lossy compression are appropriately selected when the article is to be compressed.

Figure 9A:
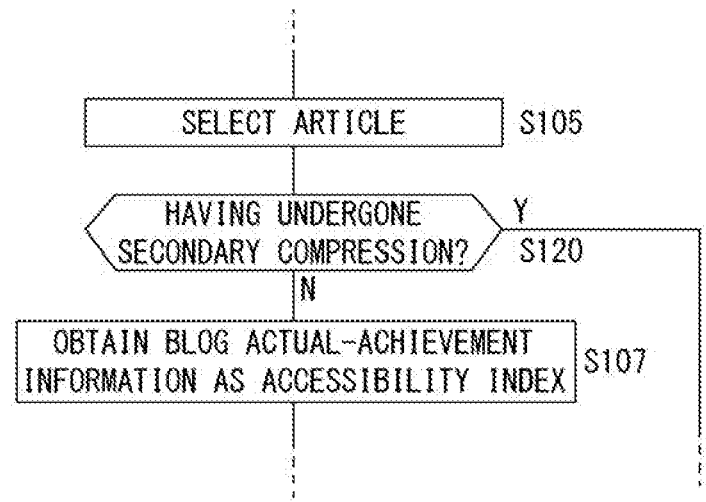
FIGS. 9A and 9B are flowcharts of a compression determining process and a compressing process according to a second embodiment.
Figure 9B:
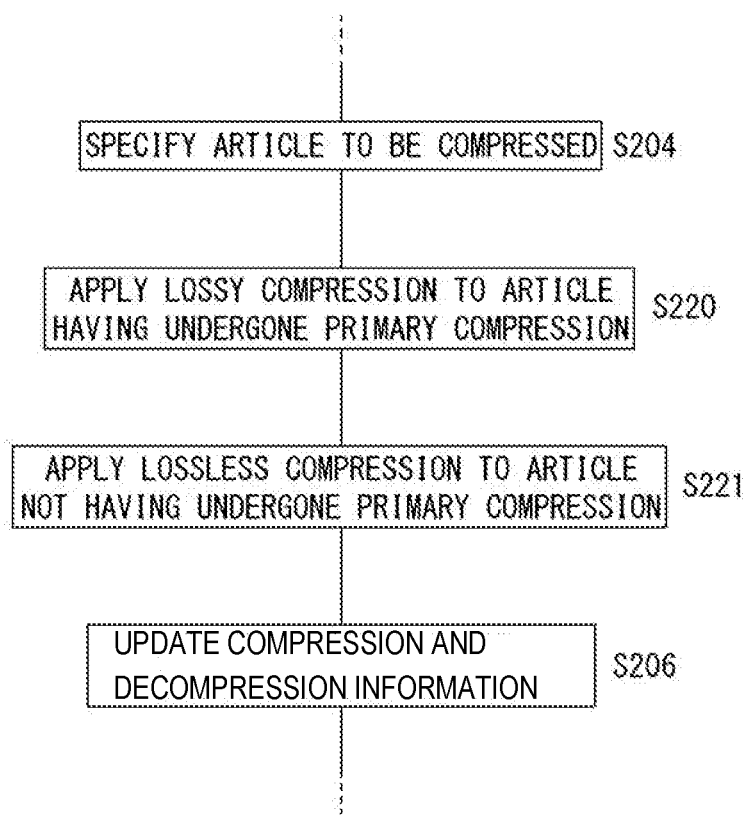

FIG. 9A and FIG. 9B illustrate a compression determining process and a compressing process executed by the blog server 1. However, the blog server 1 achieves this embodiment by replacing a part of the compression determining process illustrated in FIG. 5 with a process illustrated in FIG. 9A, and by replacing a part of the compressing process illustrated in FIG. 6 with a processing illustrated in FIG. 9B.

First, the compression determining process will be described with reference to FIG. 5 and FIG. 9A.

The blog server 1 appropriately selects the one blog to be compressed by executing the processes in the steps S101 to S104.

The blog server 1 selects the one article that belongs to the blog determined as the blog to be compressed by executing the step S105.

Next, the blog server 1 determines whether or not the selected article is having undergone a secondary compression by executing step S120 in FIG. 9A instead of the step S106.

According to this embodiment, the compression is divided into two stages. More specifically, when a compression at a first stage is executed on the uncompressed article and the decompressed article, lossless compression is applied as a primary compression. Next, when the compressed article that has been compressed by the primary compression is further compressed, lossy compression is applied as a secondary compression.

That is, the process in the step S120 in FIG. 9A is the same process as a process of determining whether or not it is the article to which lossy compression has been applied.

When a determination is made in the step S120 that it is not the article having undergone the secondary compression, no further compression is executed, and the process progresses to the step S110.

In contrast, when determining that it is not the article having undergone the secondary compression, the blog server 1 progresses the process to the step S107 from the step S120. Respective processes in the steps S107 to S111 in FIG. 5 are as described above, and thus the detailed description will be omitted.

Next, the compressing process executed by the blog server 1 will be described with reference to FIG. 6 and FIG. 9B.

The blog server 1 specifies the one blog determined in the compression determining process as the blog to be compressed by executing steps S201 to S203.

Next, in subsequent step S204, the blog server 1 specifies all the articles to be compressed in the blog to be compressed.

The blog server 1 executes steps S220 and S221 illustrated in FIG. 9B instead of the step S205.

The specified article to be compressed in the previous step S204 is any one of the uncompressed article, the decompressed article, and the compressed article to which the primary compression (lossless compression) has been applied. That is, since the compressed article to which the secondary compression (lossy compression) has been applied and which is in the status that cannot be compressed any more is not selected as the article to be compressed, such an article is not included in the article to be compressed and specified in the step S204. Next, the article having undergone the primary compression is only the compressed article to which lossless compression has been applied, and the article not having undergone the primary compression is the uncompressed article or the decompressed article.

By executing the step S220, the blog server 1 applies lossy compression to the article to which lossless compression has been already applied but which is determined as to be further compressed. This further secures the storage resource.

Next, the blog server 1 applies lossless compression to the article which is the uncompressed article or the decompressed article and which is determined as to be compressed by further executing the step S221. This secures the storage resource.

After compressing the article to be compressed by executing the steps S220 and S221, the blog server 1 updates, in the step S206, the compression and decompression information in the managing DB 53. More specifically, for example, the flag information is updated so as to indicate that the article in the blog and compressed at this time is in the compressed status. Moreover, a compression past-record is added. At this time, it is desirable not only to indicate the compressed status but also to store with a distinction between whether lossless compression is applied or lossy compression is applied. This facilitates a determination on what compression scheme has been applied.

Note that when lossy compression and decompression are repeated on one article, an image, a motion image, etc., contained in such an article may become excessively rough. In order to avoid this, the upper limit value for the number of applications of lossy compression may be set. In this case, it is desirable to store the number of applications of lossy compression in the compression and decompression information. Next, in the process in the step S220, lossy compression is to be applied to the article having undergone the primary compression and having the number of applications of the lossy compression that is smaller than the upper limit value.

By executing the above processes, for example, for the article that has a low accessibility, lossless compression is first applied to secure the storage resource. When there is an access request to this article, the article can be returned to the article that has the same quality as that of the uncompressed article.

Moreover, when, for example, there is no access request at all to the article to which lossless compression has been applied during a certain time period, lossy compression is applied to further secure the storage resource.

Accordingly, since lossless compression that enables the article to return to the article that has the same quality as that of the uncompressed article is applied to the article which has no access request for a certain time period by chance, the article can be returned to, in accordance with an access request received subsequently, the status that does not cause an audience to feel a difficulty in viewing the article.

Moreover, for the article that has no access request for a long time period, since lossy compression is applied through lossless compression, the storage capacity is secured maximally, while at the same time, the minimum quality is maintained.

Note that when the accessibility of the article is determined as quite low, the storage resource securement may be prioritized by applying lossy compression without through lossless compression. Moreover, when the necessary storage resource securement for the blog is difficult, lossy compression may be applied without through lossless compression.

5. Third Embodiment

According to this embodiment, and example in which the total-data-amount upper limit value that is the upper limit value of the total data amount permitted for each blog is set appropriately will be described.

There are some users who lost the interest after uploading several articles, but there are also some users who continues utilizing the blog for a long time. Under such a circumstance, it is sometimes inappropriate to uniformly set the same total-data-amount upper limit value. In particular, regarding the blog which has a large number of posted articles and which has a large number of audiences, when the blog has reached the total-data-amount upper limit value, the uniform setting is not suitable in view of the user's convenience.

Hence, the total-data-amount upper limit value is to be set in accordance with the utilization status of the blog for each user.

The blog server 1 specifies, in step S401, the one blog subjected to the process, and executes processes in steps S402 to S406 to be described below on the blog.

The blog server 1 determines, in the step S402, whether or not the total-data-amount upper limit value has been set to the blog subjected to the process. When the total-data-amount upper limit value has not been set, a default value (e.g., 2 GB) of the total-data-amount upper limit value is set in the step S403, and the process progresses to a process in the step S406.

When the total-data-amount upper limit value has been set, the blog server 1 obtains, in the step S404, the information that indicates the describer's utilization status among various pieces of information stored in the managing DB 53.

The information that indicates the describer's utilization status is, for example, the information that indicates whether or not the describer frequently utilizes the blog, the information that indicates whether or not the blog is a popular blog, and the information that indicates a leeway to the total-data-amount upper limit value presently set to the blog. One of those pieces of information may be obtained, or plural pieces of information may be obtained.

In this example, as the information that indicates whether or not the describer frequently utilizes the own blog, a value that indicates the blog update frequency is obtained, and as the information that indicates a leeway to the total-data-amount upper limit value of the blog, the total data amount of the blog and the total-data-amount upper limit value are obtained.

Subsequently, the blog server 1 sets, in the step S405, the total-data-amount upper limit value in accordance with the utilization status.

An example will be described. For example, based on the value that indicates blog update frequency, the blog is evaluated as follows in three stages.

Blog update frequency, equal to or greater than once per a day=update frequency high.

Blog update frequency, equal to or greater than once per a week but less than once per a day=update frequency middle.

Blog update frequency, less than once per a week=update frequency low.

Furthermore, the total data amount and total-data-amount upper limit value of the blog are obtained, and the available capacity ("total-data-amount upper limit value set to blog"–"total data amount of blog") of the blog is calculated based on those pieces of information.

Next, a process of incrementing the total-data-amount upper limit value by one stage is executed on the blog which has a high update frequency and which has an available capacity that is less than 50 Mega Byte (MB). Moreover, the process of incrementing the total-data-amount upper limit value by one stage is executed on the blog which has a middle update frequency and which has an available capacity that is less than 30 MB. Furthermore, the process of incrementing the total-data-amount upper limit value by one stage is executed on the blog which has a low update frequency and which has an available capacity that is less than 10 MB.

The process of incrementing the total-data-amount upper limit value by one stage is a process of, for example, setting the new total-data-amount upper limit value that is a capacity obtained by adding 100 MB to the present total-data-amount upper limit value.

Next, the blog server 1 determines, in the step S406, whether or not there is the next blog subjected to the process. When there is the next blog subjected to the process, the process returns to the step S401, and the next blog is specified. Conversely, when there is no next blog subjected to the process, the total-data-amount upper limit value setting process illustrated in FIG. 10 is terminated from the step S406.

By executing the above-described processes, even if the blog has a little available capacity, as for the blog which has a little update frequency and which has a low urgency to change the total-data-amount upper limit value, the total-data-amount upper limit value is unchanged. Hence, a possibility of providing a waste storage resource is suppressed.

In contrast, regarding the blog which has a little available capacity and which has a high update frequency, the total-data-amount upper limit value that becomes higher than the present value is set by changing the total-data-amount upper limit value. Hence, an occasion in which the available capacity is insufficient when a new article is posted on the blog and the new article cannot be posted is easily avoided.

Figure 10:
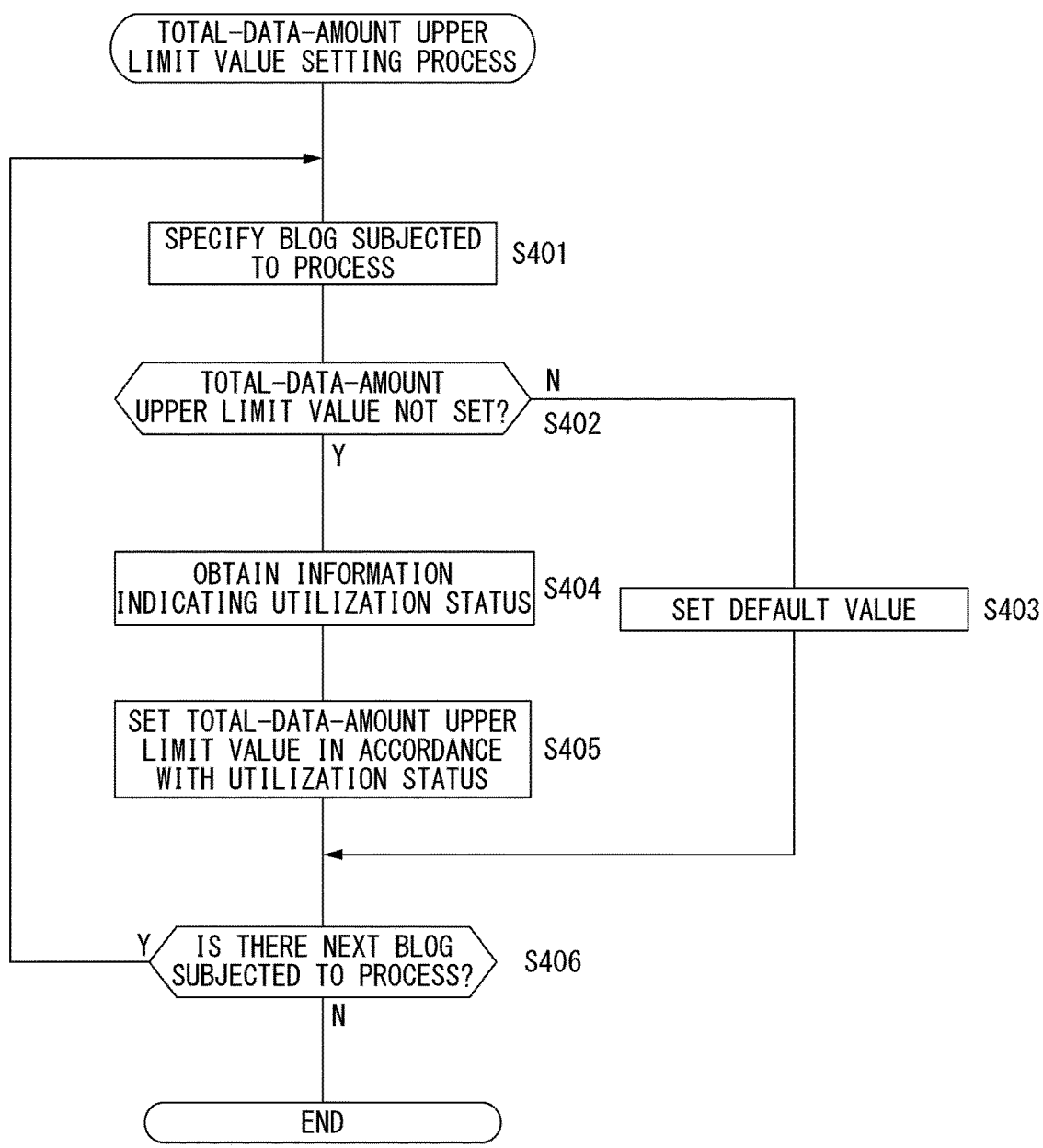
FIG. 10 is a flowchart of a total-data-amount upper limit value setting process according to a third embodiment.

Note that when the total-data-amount upper limit value is changed in accordance with the utilization status of the blog by the user, it is desirable to periodically execute a series of processes illustrated in FIG. 10. Periodical execution enables a setting of the appropriate total-data-amount upper limit value when the user's utilization status has changed, for example, when the user who has frequently posted the articles quits posting.

Note that although the example in which the total-data-amount upper limit value is increased has been described above, an example in which the total-data-amount upper limit value is decreased may be applicable. When, for example, the default total-data-amount upper limit value is 2 GB, regarding the blog to which the total-data-amount upper limit value that is larger than 2 GB is set and which is determined as the blog that has a low update frequency, the storage resource is secured by decreasing the total-data-amount upper limit value. In this case, when the total data amount of the blog exceeds the new total-data-amount upper limit value that is set again, it is desirable to execute the compression determining process and the compressing process to suppress the total data amount of the blog to be within equal to or smaller than the total-data-amount upper limit value.

In particular, regarding the blog that has a decreasing number of unique users who have accessed the blog, since the possibility of executing the decompressing process in accordance with an access request is still low even if the execution of the compressing process on the article is necessary because of the decreased total-data-amount upper limit value. Hence, this is effective.

Moreover, a case in which the total-data-amount upper limit value is eliminated in accordance with the user's utilization status and the user is allowed to utilize without any limit may be possible. For example, the total-data-amount upper limit value is eliminated for the blog which has a remarkably high describer's update frequency and which has a large number of audiences. This enables such a blog to be excluded from the blog subjected to the processes of setting again and updating the total-data-amount upper limit value in subsequent occasion, and thus the process load on the blog server 1 can be reduced.

6. Fourth Embodiment

According to this embodiment, the accessibility index to be obtained is a value calculated from plural pieces of information. That is, according to the first embodiment, one of the information stored as the blog actual-achievement information in the managing DB 53 is obtained as the accessibility index. In contrast, according to this embodiment, the accessibility index is calculated and obtained from the plural pieces of information stored as the blog actual-achievement information in the managing DB 53.

In order to do so, the blog server 1 may calculate the accessibility index before executing the compression determining process illustrated in FIG. 5. Needless to say, the calculation may be executed in each case.

Figure 11:
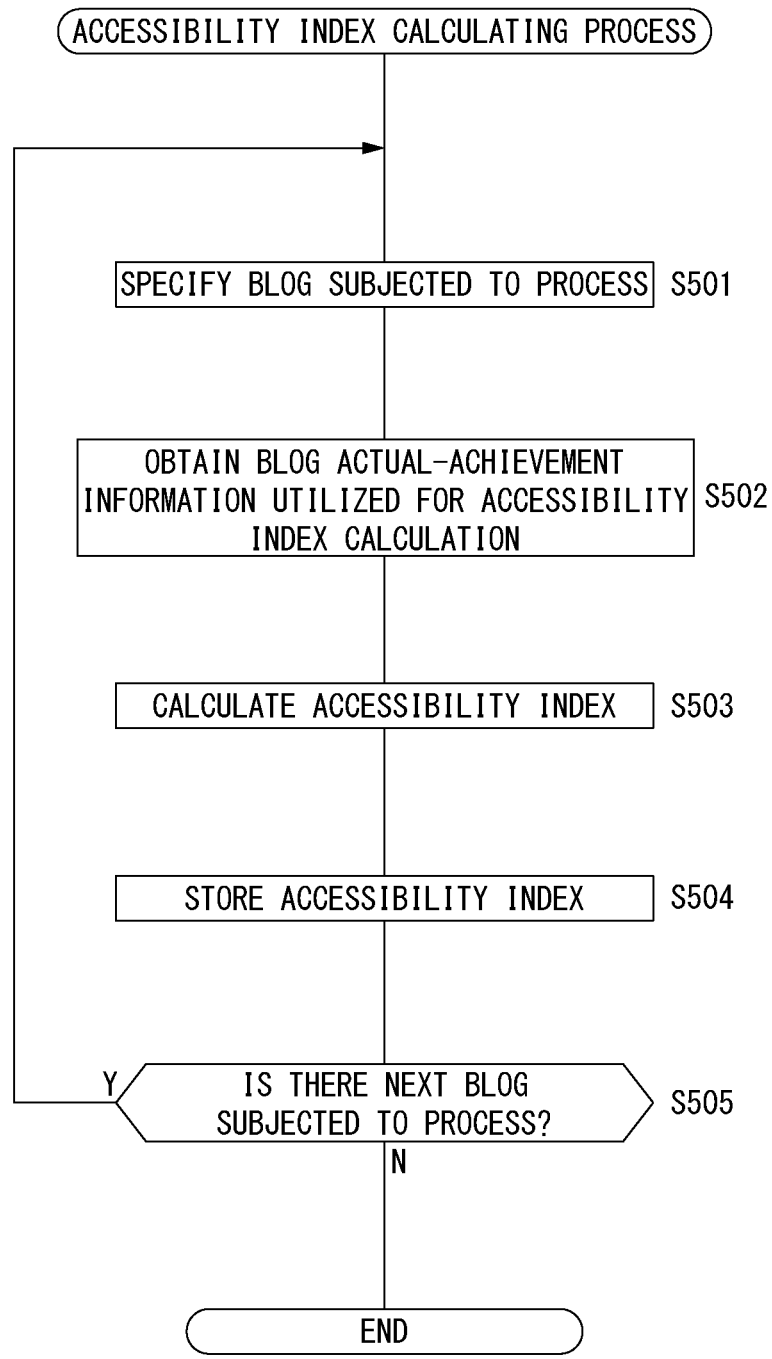
FIG. 11 is a flowchart of an accessibility index calculating process according to a fourth embodiment.

FIG. 11 illustrates a process of calculating the accessibility index.

The blog server 1 specifies, in step S501, the one blog to be subjected to the process. In the following processes, the accessibility index is calculated for the specified blog.

The blog server 1 obtains, in step S502, the information utilized for calculating the accessibility index for each of the plurality of articles contained in the blog subjected to the process from the blog actual-achievement information in the blog DB 51. That is, when the blog that has ten articles is subjected to the process, the information is obtained for each of the ten articles.

More specifically, the plural pieces of information are obtained among information such as the number of page views for each article, the number of unique users who have accessed the article, the total linked number for each article, the value that indicates the ranking of the article, the length of the time period at which there is no access request to the article, the number of page views for the article within a predetermined time period, the value that indicates the increasing tendency of the page view for the article, and the number of clicks to the advertisement provided on the article page, all stored as the blog actual-achievement information for each article.

The blog server 1 calculates, in step S503, the accessibility index for each article from the plural pieces of obtained information. At this time, the accessibility index of the article may be obtained by adding the normalized value for each kind of information, or may be calculated by weighting in accordance with the importance for each kind of information.

Subsequently, the blog server 1 stores, in step S504, the calculated accessibility index for each article in the managing DB 53. By storing the accessibility index in the managing DB 53, the stored accessibility index itself may be obtained in the process in the step S107 of the compression determining process as illustrated in FIG. 5.

Next, the blog server 1 determines, in step S505, whether or not there is the next blog subjected to the process, and when there is the next blog subjected to the process, returns the process to the step S501, and specifies the next blog subjected to the process. Conversely, when there is no next blog subjected to the process, the accessibility index calculating process illustrated in FIG. 11 is terminated from the step S505.

Note that the blog subjected to the process may be all the blogs stored in the blog DB 51, or may be some of the blogs. As for an example in which some of the blogs are to be subjected to the process, for example, the blog which remarkably exceeds the blog compression determination threshold and which needs all the articles to be compressed does not need the calculation of the accessibility index for each article. Hence, such a blog may be excluded from the blog subjected to the process. In other words, the blog which slightly exceeds the blog compression determination threshold needs a determination on which article should be compressed, and such a blog is subjected to the calculation of the accessibility index.

Note that in a case in which the accessibility index calculating process in FIG. 11 is periodically executed by a batch process, when the subject for the accessibility index calculating process is all the articles of all the blogs stored in the blog DB 51, the degree of freedom for process scheduling can be improved by calculating the accessibility index through the batch process etc., in advance.

7. Fifth Embodiment

According to this embodiment, an example will be described in which the compression is executed from the article that has a low accessibility index until the total data amount of the blog subjected to the process becomes equal to or smaller than a predetermined value.

Figure 12:
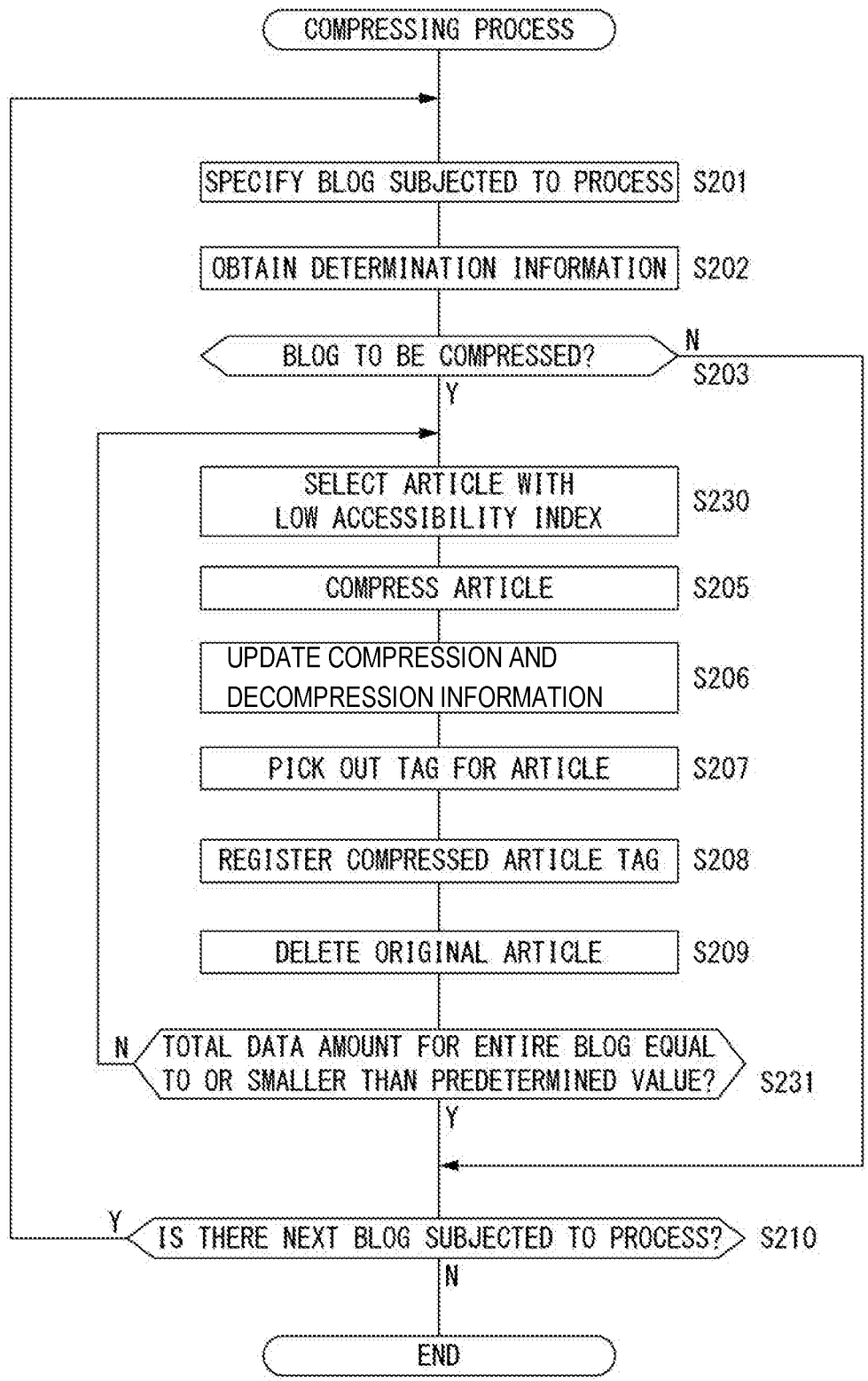
FIG. 12 is a flowchart of a compressing process according to a fifth embodiment.

FIG. 12 illustrates a flow of the compressing process. Since the outline of the flow of the process is the same as that of the compressing process illustrated in FIG. 6, the detailed description will be omitted as appropriate.

The blog server 1 selects one of the blogs to be compressed by executing the processes in the steps S201 to S203. Next, the respective following processes are executed on the selected blog.

First, the blog server 1 selects, in step S230, the article with a low accessibility index among the articles that belong to the selected blog. Next, the compression on the article, etc., is executed by executing the processes in the steps S205 to S209 on the article. The process in the step S230 is a process that is executed instead of the process in the step S204 in FIG. 6.

The blog server 1 that has completed the compression on the one article determines, in subsequent step S231, whether or not the total data amount of the entire blog is equal to or smaller than the predetermined value.

When the total data amount is larger than the predetermined value, the determination is made such that the compression on each article in this blog is still insufficient, and the process returns to the process in the step S230, and the next article is selected.

Note that when there is no article to be selected next because all the articles have been compressed, the process transitions to the step S210 without a transition to the step S230, and a determination may be made on whether or not to start the process for the next blog.

When the total data amount of the selected blog becomes equal to or smaller than the predetermined value, the blog server 1 terminates the compressing process on this blog, and executes, in the step S210, the process of selecting the next blog subjected to the process.

The predetermined value applied in the process in the step S231 may be, for example, the blog compression determination threshold. It becomes unnecessary to newly calculate and store a value applied for the determination by applying the blog compression determination threshold. This contributes to reduction of a process load and to securement of the storage resource.

Moreover, in addition to the above case, a value obtained by multiplying the blog compression determination threshold by a coefficient like 0.8 may be applied as the predetermined value. When the blog to be compressed is owned by the user who frequently posts the articles, it becomes possible to suppress that the total data amount exceeds again the blog compression determination threshold by a single posting. Accordingly, since a time until the blog becomes again the blog to be compressed is extended, the execution frequency of the compressing process illustrated in FIG. 12 (or the processes in the steps S105 to S110 in FIG. 5) can be reduced. This achieves a reduction of the process load on the blog server 1.

According to this embodiment, the compressing process on each article is immediately terminated in response to the total data amount of the blog subjected to the process which becomes equal to or smaller than the predetermined value. Hence, the compressing process that is likely to be excessive can be suppressed, and thus achieving a reduction of the process load on the blog server 1.

Note that the predetermined value may be provided or not provided in accordance with a situation. When, for example, the accessibility indexes of all the articles of the blog subjected to the process are low, the compressing process on all the articles (i.e., the processes in the steps S205 to S209 in FIG. 12) may be executed without setting the predetermined value. Such a blog has a low possibility for an execution of the decompressing process on the article in response to the audience's access. Hence, the storage resource can be secured without a concern for an increase in process load by the execution of decompressing process.

8. Sixth Embodiment

According to this embodiment, an example will be described in which a determination is made on whether or not the compression on the article belonging to the blog is permitted based on how much the total data amount of the blog exceeds the blog compression determination threshold.

Figure 13:
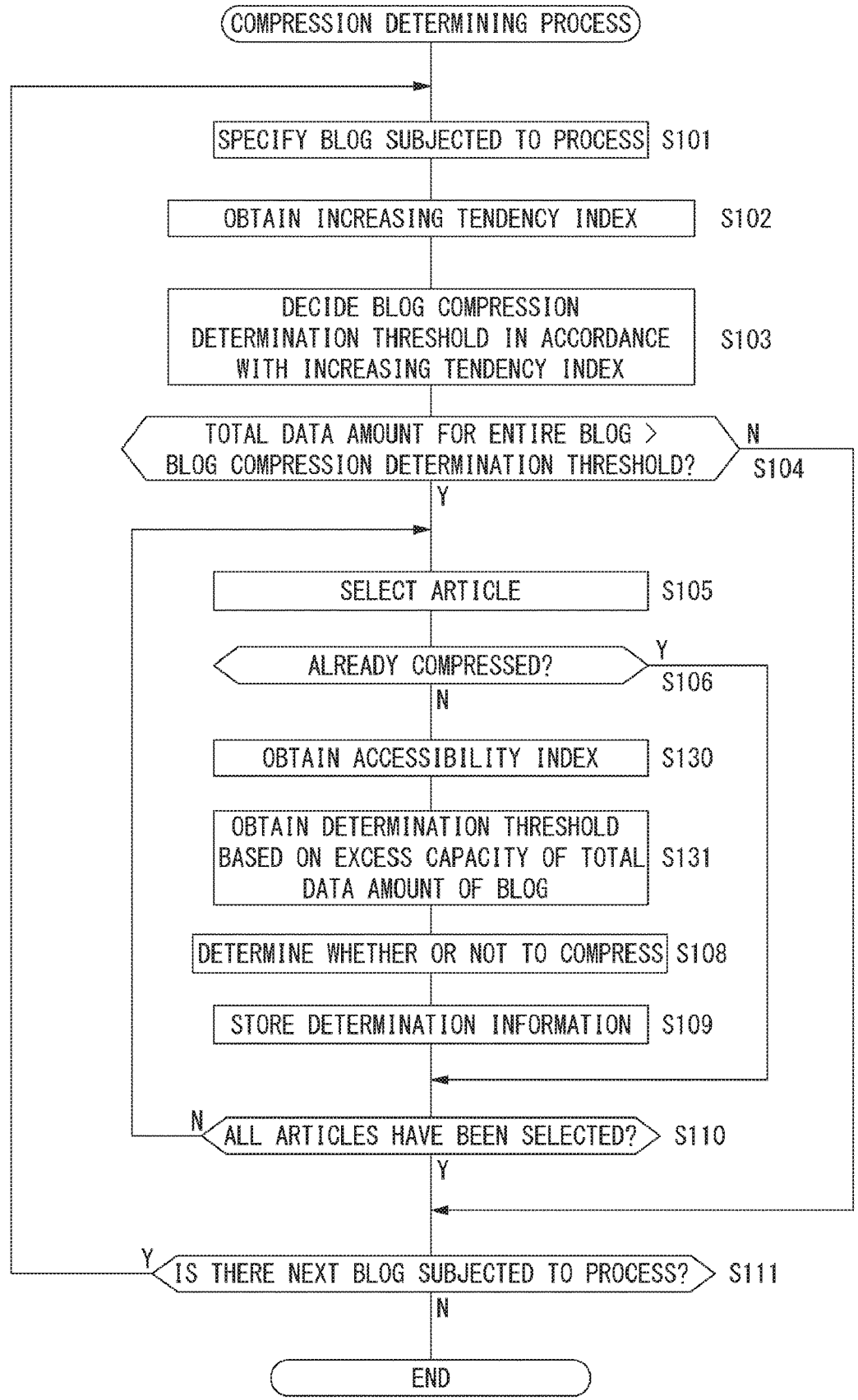
FIG. 13 is a flowchart of a compression determining process according to a sixth embodiment.

FIG. 13 illustrates a compression determining process. Since the outline of the flow of the process is the same as that of the compression determining process illustrated in FIG. 5, the detailed description will be omitted as appropriate.

The blog server 1 determines, in the steps S101 to S104, whether or not the blog is the blog to be compressed. Regarding the blog determined as the blog to be compressed at this time, how much the total data amount exceeds the blog compression determination threshold (i.e., the exceeding capacity) is grasped.

Subsequently, the blog server 1 determines whether or not the article selected in the step S105 should be compressed by executing the subsequent steps S106 to S109. At this time, whether or not to compress is determined in accordance with the largeness of the accessibility index, according to this embodiment, whether or not to compress is also determined with the above-described exceeding capacity being taken into consideration.

More specifically, in the foregoing first embodiment, for example, the example has been described with respect to the step S108 in FIG. 5 in which, when the length of a time period at which there is no access request for the article is selected as the accessibility index, it is determined whether or not the length of the time period is equal to or longer than three years, and the article that has no access request for equal to or longer than three years is determined as having a low accessibility, and thus determined as the article to be compressed.

According to this embodiment, the threshold that is "three years" is changed in accordance with the exceeding capacity. As an example, for the blog that has a large exceeding capacity, i.e., the blog that has a large number of articles which should be compressed, the threshold that is "two years" is set. This causes the article that has no access request for 2.5 years to be also subjected to the compressing process, and thus the securement of the storage resource is prompted. Moreover, for the blog that has a small exceeding capacity, i.e., the blog that has merely a small number of articles which should be compressed, the threshold that is "five years" is set. Hence, the article that has no access request for three years is excluded from the article subjected to the compressing process. This decreases the possibility of an occurrence of the decompressing process on the compressed article, while at the same time, efficiently secures the storage resource.

Therefore, the blog server 1 obtains, in step S130, the accessibility index, and obtains, in step S131, a determination threshold based on the exceeding capacity of the total data amount of the blog subjected to the process. In the step S131, instead of the obtainment of the determination threshold, a process of calculating the determination threshold, i.e., the process of calculating the threshold, such as two years, three years, or five years, as described above may be executed.

According to this embodiment, by setting the appropriate determination threshold in accordance with the total data amount of each blog, an appropriate storage resource is secured.

9. Seventh Embodiment

According to this embodiment, the blog server 1 executes, for each article, not only the determination on whether or not to compress based on the increasing tendency index and on the accessibility index, but also a determination on whether or not to decompress the already-compressed article.

Figure 14:
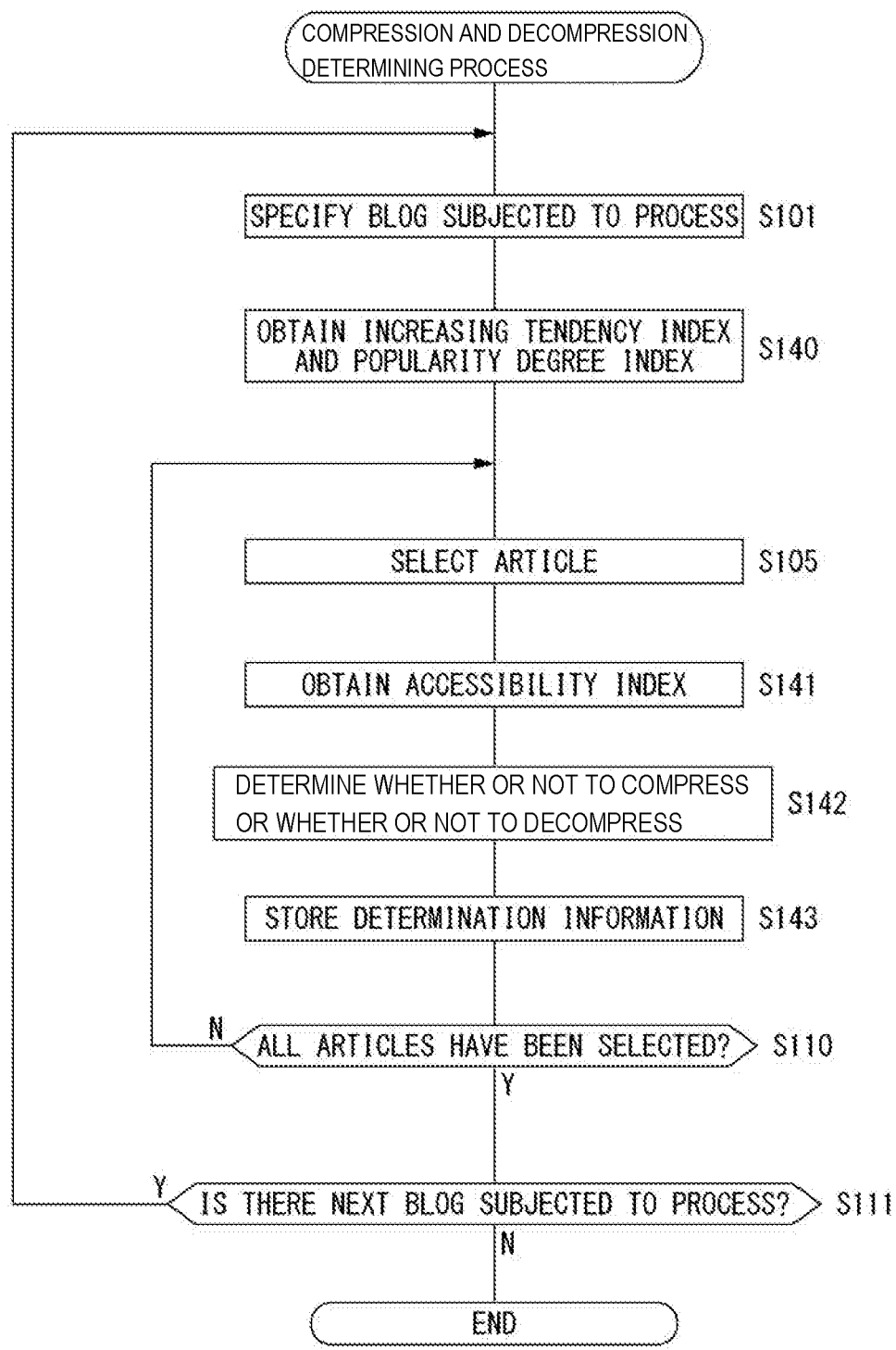
FIG. 14 is a flowchart of a compression and decompression determining process according to a seventh embodiment.

The blog server 1 executes, for example, a compression and decompression determining process in FIG. 14 periodically or at a predetermined timing. The process in FIG. 14 can be considered as the process instead of the compression determining process in FIG. 5 in the first embodiment. The same step number will be given to the same process as that of the process in FIG. 5, and the duplicated description will be omitted.

The blog server 1 specifies the blog subjected to the process (S101), obtains the increasing tendency index and the popularity degree index (S140), and then executes a determination on each article in the steps S105, S141, S142, S143, and S110.

The blog server 1 that has selected one article in the step S105 progresses the process to the step S141 to obtain the accessibility index regardless of whether or not the article has been already compressed. In this process, the blog actual-achievement information as the accessibility index may be obtained like the step S107 of FIG. 5, or the accessibility index calculated in FIG. 10 may be obtained.

Next, the blog server 1 executes, in the step S142, the determination on whether or not to compress and on whether or not to decompress.

That is, the blog server 1 determines, based on the increasing tendency index, whether or not to compress like the step S108 in FIG. 5 for the uncompressed article or the decompressed article.

In contrast, for the compressed article, the blog server 1 executes the determination on whether or not to decompress by utilizing the popularity degree index and by the accessibility index.

For example, the popularity degree index is classified into three classes, such as high/middle/low, by utilizing information such as the total number of page views, etc.

Next, as the accessibility index, for example, the number of page views N for the article is utilized: and the blog that has a low popularity degree index; decompressed when the number of page views N for the article is equal to or greater than N1.

the blog that has a middle popularity degree index; decompressed when the number of page views N for the article is equal to or greater than N2.

the blog that has a high popularity degree index; decompressed when the number of page views N for the article is equal to or greater than N3.

However, N1>N2>N3.

That is, in the case of the compressed article of a popular blog, the decompression is permitted when the page view actual achievement has slightly increased. However, in the case of the compressed article of an unpopular blog, the determination is made with the threshold for permitting the decompression in accordance with the number of page views being increased. Hence, the article of the popular blog is likely to be permitted for decompression even once compressed. This is because that the accessibility is likely to increase in the case of the popular blog.

As another example, for example, as the accessibility index, a value K that indicates the increasing tendency of the page view for the article is utilized: and the blog with a low popularity degree index; decompressed when the increasing tendency value K is equal to or greater than K1.

the blog with a middle popularity degree index; decompressed when the increasing tendency value K is equal to or greater than K2.

the blog with a high popularity degree index; decompressed when the increasing tendency value K is equal to or greater than K3.

However, K1>K2>K3.

That is, in the case of the compressed article of a popular blog, when a slight increasing tendency of the page view is observed, the decompression is permitted. However, in the case of the compressed article of an unpopular blog, a determination is made such that the decompression is permitted when a remarkable increasing tendency of the page view is observed. In this case, also, the article of the popular blog is likely to be permitted for decompression even once compressed.

Next, the blog server 1 stores, in the step S143, the determination on whether or not to compress or the determination on whether or not to decompress for the article as determination information. For example, the flag on whether or not to compress or the flag on whether or not to decompress for the article is updated or maintained as the determination information in the managing DB 53.

The steps S110 and S111 are the same as those in FIG. 5.

Figure 15:
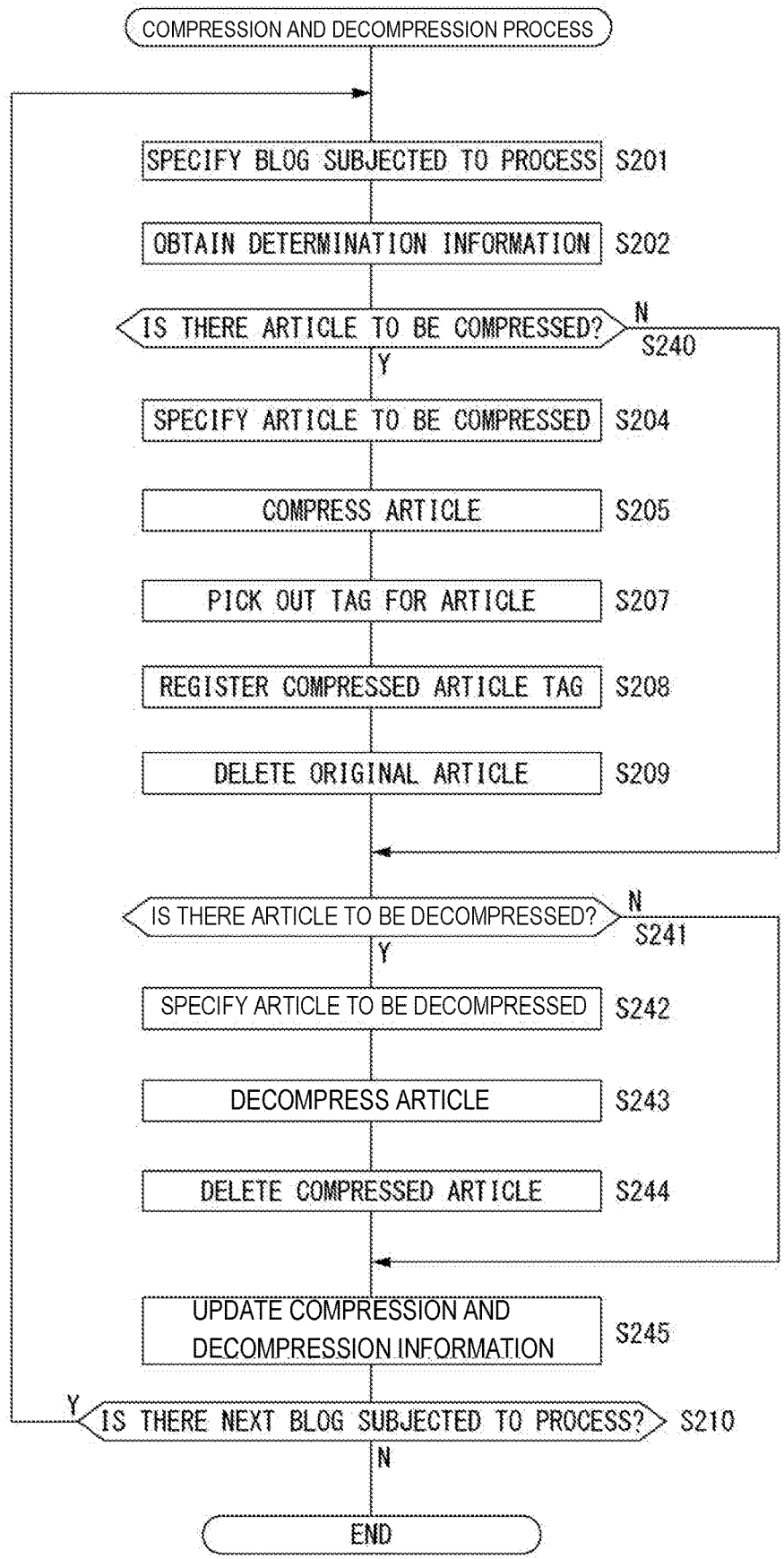
FIG. 15 is a flowchart of a compressing and decompressing process according to the seventh embodiment.

The blog server 1 also executes a compressing and decompressing process in FIG. 15 as needed. This is a process instead of the compressing process in FIG. 6 in the first embodiment. The same process as that in FIG. 6 will be denoted by the same step number, and the detailed explanation will be omitted.

The blog server 1 specifies, in the step S201, the blog subjected to the process, and obtains, in the step S202, the determination information.

The blog server 1 refers to the determination information on whether or not to compress and determines whether or not there is the article to be compressed in step S240. Next, the article to be compressed is specified in the step S204. Although a determination on whether or not there is any compressed article may be made in the step S240, a determination on whether or not the blog subjected to the process is the blog to be compressed may be made.

When one or the plurality of articles are specified as the articles to be compressed, the blog server 1 executes, in the step S205, the compressing process on each data on the one or the plurality of articles, sets and registers the tag, and deletes the original data on the article in the steps S207, S208, and S209 like the case in FIG. 5.

After executing the above steps S205 to S209, or after determining in the step S240 that there is no article to be compressed, the blog server 1 determines, in step S241, whether or not there is an article to be decompressed. That is, a determination is made on whether or not there is the article that should be decompressed among the compressed articles with reference to the determination information obtained in the step S202. When there is no article to be decompressed, the process progresses to step S245.

When there is one or the plurality of articles to be decompressed, the blog server 1 specifies, in step S242, the article to be decompressed, and executes, in subsequent step S243, a decompressing process on the specified article. In this case, the decompressed article data is combined with the blog instead of the compressed article so far. Moreover, the blog server 1 deletes, in step S244, the compressed article.

This causes the compressed article in the blog to be returned to the decompressed article in accordance with the increase in accessibility.

The blog server 1 updates, in step S245, the compression and decompression information in the managing DB 53. In this case, the flag information is updated so as to indicate that the compressed article in the blog is in a compressed status. Moreover, the compression past-record is added. Furthermore, the flag information is updated so as to indicate that the decompressed article in the blog is in a decompressed status. Still further, the decompression past-record is added.

When completing the compressing process and the decompressing process for one blog through the above processes, the blog server 1 checks, in step S210, whether or not to execute the process on other blogs.

Next, when the process has been completed for all the blogs subjected to the process at this time, the compressing and decompressing process in FIG. 15 is terminated from the step S210.

By executing the above compressing and decompressing process in FIG. 15, the actual compressing process on the article determined as compression permitted through the compression and decompression determining process in FIG. 14 and the actual decompressing process on the article determined as decompression permitted are executed. This achieves a recovery of the storage resource, and an execution of the decompression on the article that has the increasing accessibility, thereby improving the performance when the access is made.

When, for example, the article itself is updated such that regarding a given article of a blog, the describer of the blog changes the contents, or the audience posts a comment to the article, the accessibility to this article increases. According to this embodiment, an operation of canceling the compression is achieved for such an article.

Accordingly, such an operation is perceived in advance, and the compressed status is canceled in advance for the article of the blog which has been already compressed but which has an increasing accessibility.

This enables a prompt distribution of the article without the decompressing process at a time point at which an actual access is made.

Moreover, a determination that the compressed article in the blog with a popularity increasing tendency is selected as the article to be decompressed is enabled.

Regarding the blog that has an increasing popularity, since all the articles thereof have an increasing accessibility, the compressed article is decompressed in advance. This eliminates the necessity of the decompressing process at the time of viewing, improves the response performance, and reduces the process load at this time.

10. Eighth Embodiment

According to this embodiment, an example in which the blog server 1 determines whether or not to decompress the already-compressed article based on the contents of the article will be described.

For example, regarding an article that mentions a certain theme, although such an article is not getting attention a lot at a time point at which the article is uploaded, the possibility such that the article is searched increases (i.e., the accessibility increases) few years later because any incident or event relating to the theme mentioned in the article occurs in the world, and the linked number to the article increases.

Hence, such a tide is perceived in advance, and for the article which has been already compressed but which has the increasing accessibility, the compressed status is canceled in advance.

This enables a prompt distribution of the article without the decompressing process at a time point at which the actual access request is made.

Figure 16:
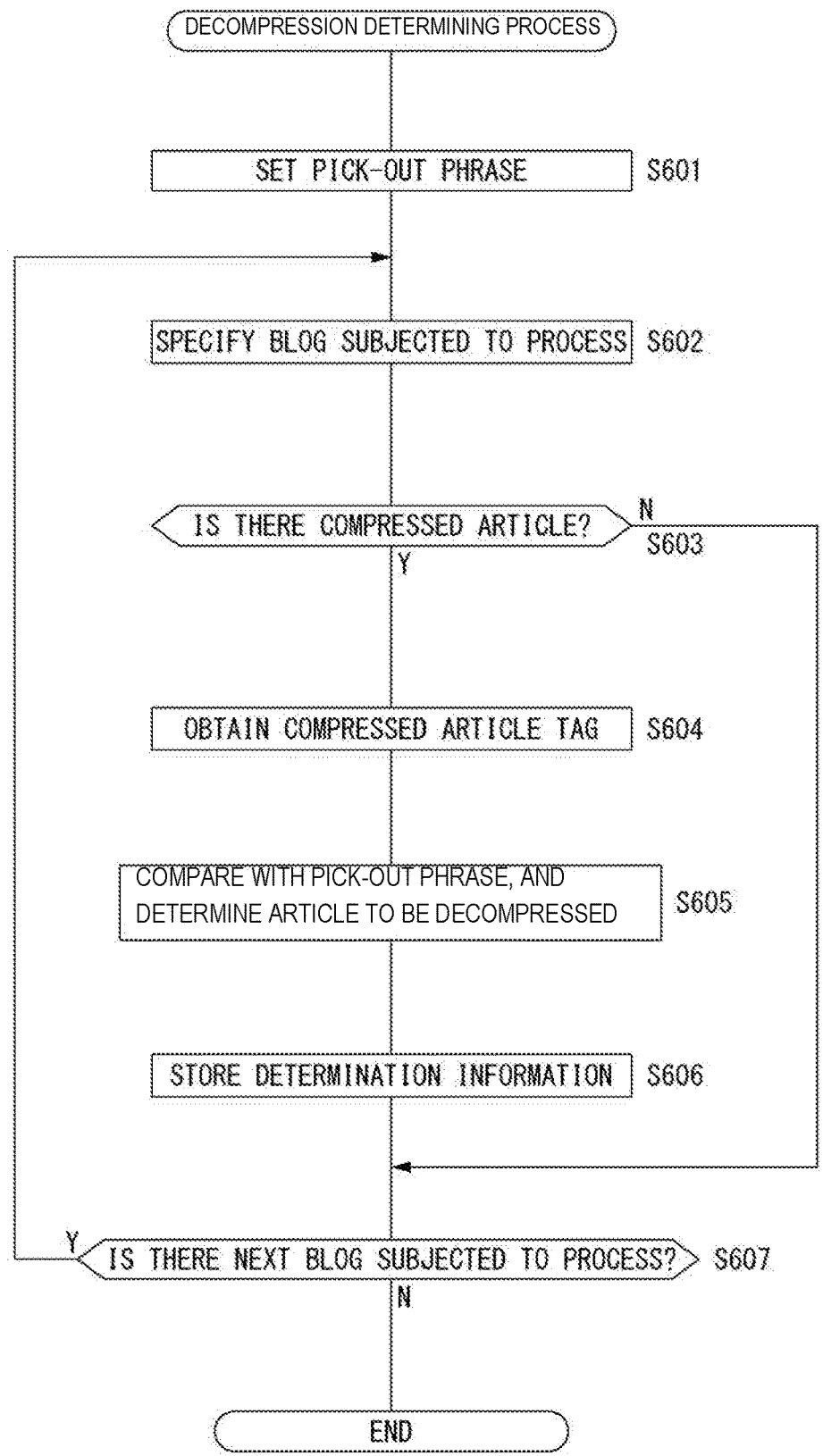
FIG. 16 is a flowchart of a decompression determining process according to an eighth embodiment.

FIG. 16 illustrates a decompression determining process. In addition to each process according to the first embodiment, the blog server 1 executes this decompression determining process periodically, etc., as needed.

The blog server 1 sets, in step S601, one or a plurality of pick-out phrases. For example, current-news words are set as the pick-out phrases. Examples are words frequently appearing in newspapers and news, words often used relating to entertainment, and fad words. Alternatively, a genre or relevant words that are in the news may be set as pick-out phrases. In the case of, for example, a time period at which the Olympics are being held, a genre "sport", the names of various games, the name of a player are set as the pick-out phrase.

The blog server 1 specifies, in step S602, one blog subjected to the process. Next, the blog server checks, in step S603, whether or not there is the compressed article in the specified blog. For example, the compression and decompression information in the managing DB 53 may be checked.

When there is no compressed article, since the determination on the decompression is unnecessary, the process progresses to step S607.

When the blog contains the compressed article, the blog server 1 progresses the process to step S604, and obtains the information on the compressed article tag for the blog from the managing DB 53. The compressed article tag contains tag information set for one or the plurality of compressed articles in a compressed status at least presently. That is, this is the tag information registered in the step S208 in FIG. 6, etc.

The blog server 1 compares, in step S605, the pick-out phrase set in the step S601 with the compression tag information obtained from the managing DB 53, and determines the article to be decompressed.

That is, the article that has the same or similar registered compressed article tag to the pick-out phrase is picked out, and is determined as the article to be decompressed.

The blog server 1 stores, in step S606, the determination information in the managing DB 53. That is, the information on the article determined as to be decompressed is stored.

When the decompression determining process for one blog completes through the above processes, the blog server 1 checks, in step S607, whether or not there is the next blog subjected to the process. When there is the next blog, the process returns to step S602, the next blog to be processed is specified, and the processes subsequent to the step S603 are executed as described above.

When the process for all the blogs subjected to the process at this time has been completed, the decompression determining process in FIG. 16 is terminated from the step S607.

Figure 17:
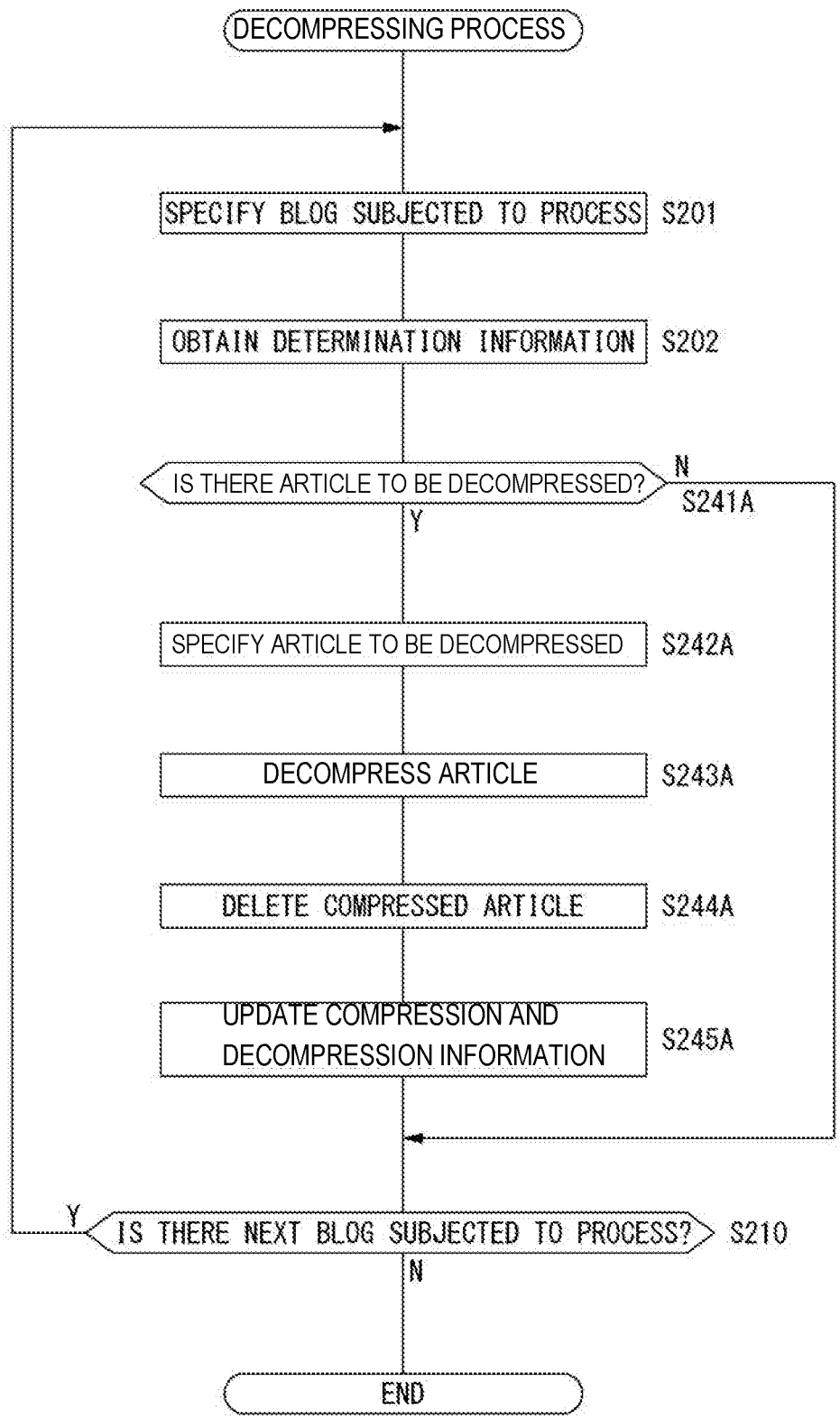
FIG. 17 is a flowchart of a decompressing process according to the eighth embodiment.

Together with this decompression determining process, the blog server 1 executes the decompressing process in FIG. 17 as needed.

The blog server 1 specifies, in the step S201, the blog subjected to the process, and obtains, in the step S202, the determination information.

The blog server 1 refers to, in step S241A, the obtained determination information, and determines whether or not there is the article that should be decompressed among the compressed articles. When there is no article that should be decompressed, the process progresses to the step S210.

When determining that there is one or the plurality of articles that should be decompressed, the blog server 1 specifies, in step S242A, the article to be decompressed, and executes, in step S243A, the decompressing process on the specified one or the plurality of articles. In this case, the decompressed article data is combined with the blog instead of the compressed article so far. Moreover, the blog server 1 deletes, in step S244A, the compressed article. Accordingly, the compressed article in the blog is returned to the decompressed article.

The blog server 1 updates, in step S245A, the compression and decompression information in the managing DB 53. In this case, the flag information is updated so as to indicate that the article that has been decompressed in the blog is in a decompressed status. Moreover, the decompression past-record is added.

When the decompressing process for one blog completes through the above processes, the blog server 1 checks, in the step S210, whether or not there is the next blog subjected to the process. When there is the next blog, the process returns to the step S201, the other blog subjected to the process is specified, and the same processes are executed.

When the process for all the blogs subjected to the process at this time has been completed, the decompressing process in FIG. 17 from the step S210 is terminated.

The actual decompressing process is executed on the article determined as decompression permitted in the decompression determining process in FIG. 16 through the above processes in FIG. 17.

Hence, the article that contains current-news words, fad words, and a theme for trend, etc., are predicted such that the accessibility thereto will increase, and is decompressed. This eliminates the necessity of the decompressing process when the number of accesses increases later.

11. Ninth Embodiment

According to this embodiment, an example will be described in which, when the compressed article is decompressed in accordance with an access, the blog server 1 determines, for a predetermined time period after the decompression, that this article is not to be compressed. For example, after the decompression is executed in accordance with an access as described with reference to FIG. 8B or FIG. 8C, when the decompressed article is stored, the compression determining process executed instead of the process in FIG. 5 is applied.

Figure 18:
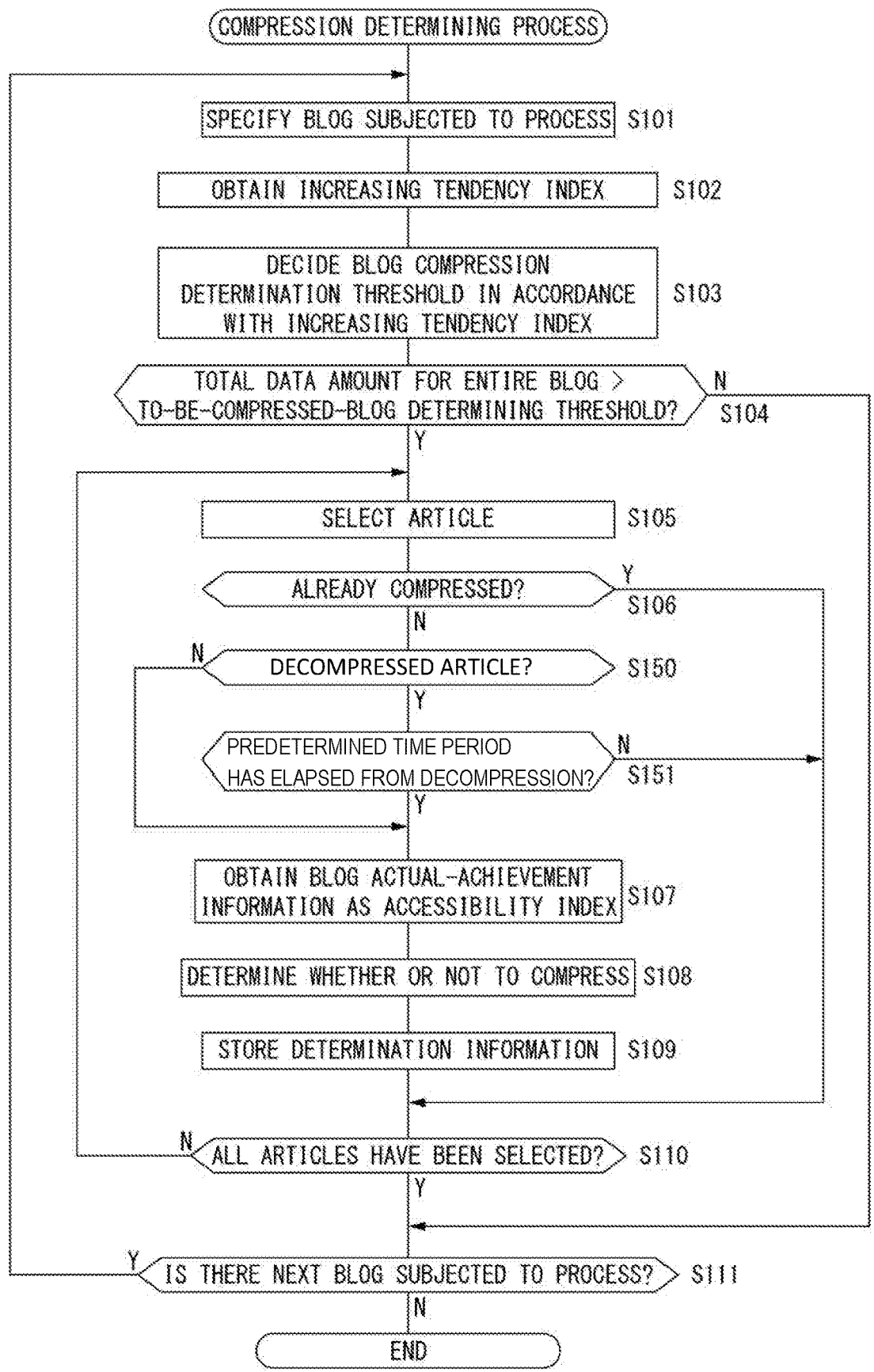
FIG. 18 is a flowchart of a compression determining process according to a ninth embodiment.

FIG. 18 illustrates the compression determining process according to this embodiment. The same step number will be given to the same process as that of FIG. 5, and the duplicated description will be omitted.

In the compression determining process illustrated in FIG. 18, the blog server 1 specifies, in the step S101, the blog, and obtains, in the step S102, the increasing tendency index. Moreover, the server sets, in the step S103, the blog compression determination threshold in accordance with the increasing tendency index, and determines, in the step S104, whether or not the total data amount in the blog subjected to the process exceeds the blog compression determination threshold. Accordingly, the server checks whether or not the blog is the blog to be compressed.

Subsequently, the blog server 1 selects, in the step S105, one article, and determines, in the step S106, whether or not the article has been already compressed. When the article has been already compressed, the process transitions to the process in the step S110.

When the article has not been already compressed, the blog server 1 determines, in step S150, whether or not the article is the decompressed article. When the article is not the decompressed article, i.e., when the article is an article in an uncompressed status, the blog server 1 executes the respective processes in steps S107 to S109 on this article.

When the article is the decompressed article, the blog server 1 determines, in step S151, whether or not the predetermined time period has elapsed after the decompression. For example, the decompression date and time of the article is checked, thereby checking whether or not the predetermined time period has passed at the present time point. The predetermined time period is, for example, one month. The check on the decompression date and time is executed with reference to the past-record information in the compression and decompression information in the managing DB 53. Note that in the case of the article having undergone compression and decompression by multiple times, the latest decompression date and time is checked.

Next, when the predetermined time period has elapsed from the decompression, the blog server 1 determines that this article can be compressed again, and executes the respective processes in the steps S107 to S109 on this article. That is, the determination on whether or not to compress in accordance with the accessibility index is made, and the determination information is stored.

In contrast, when the predetermined time period has not been elapsed from the decompression, the blog server 1 does not execute the determination on whether or not this article can be compressed, i.e., the article is treated as not subjected to the compression, and the process progresses to the process in the step S110.

Accordingly, regarding the decompressed article that is decompressed once after compressed, the determination with respect to the accessibility is not executed until the predetermined time period has elapsed from the decompression, and such an article is not determined as compression permitted.

Hence, during the predetermined time period after the decompression, when there is an access request, the distribution surely without the execution of the decompressing process is enabled.

Note that the process in the step S150 is based on the determination on whether or not the article is the decompressed article decompressed when the access request is received as illustrated in FIG. 7. Regarding reception of the access request, in addition to the access request received from the user terminal 5 for viewing, for example, an access request by a crawler may be received. The crawler in this case means a program (or an information processing device that executes an operation in accordance with the program) which periodically obtains text data and image data, etc., in various kinds of websites, and automatically constructs a DB. The access request by this crawler does not contribute to a change in popularity degree or in accessibility index for viewing.

Accordingly, when the decompression is executed in accordance with the access request by the crawler, it is desirable to determine in the step S150 that the article is not the decompressed article. That is, in this case, even immediately after the decompression, the article is subjected to the determination on whether or not to compress.

Alternatively, when the decompression is executed in accordance with the access request by the crawler, the decompressed article may be not stored as illustrated in FIG. 8A.

Furthermore, when the access request from the crawler is received, a scheme of not decompressing the compressed article at all is also considerable.

Although the crawler has been described as an example, the accesses other than the access that can be regarded as the intent of the user who is a general audience may be treated like the case of the crawler as described above.

12. Summary and Modified Example

According to the above-described embodiments, the following advantageous effects can be achieved. The blog server 1 as the information processing device according to the first to ninth embodiments includes: the tendency obtaining unit 12 that obtains an increasing tendency (e.g., an increasing tendency index like an increasing capacity average value) of a capacity (a necessary storage capacity) of a storage capacity utilized by a blog that contains one or a plurality of articles; the threshold setting unit 13 that sets, to the blog, a threshold (blog compression determination threshold) for determining whether or not to compress at least a part of the article contained in the blog in accordance with the increasing tendency; and the determining unit 14 which determines whether or not the blog is to be compressed based on the total data amount of the articles contained in the blog and on the threshold, and which determines whether or not to compress each of the articles contained in the blog in accordance with the degree of accessibility (accessibility index).

These functions determine whether or not to compress through the processes in FIG. 5, FIG. 9A, FIG. 13, FIG. 14, and FIG. 18.

When the storage resource for blogs becomes tight, a certain threshold may be set for each blog to compress the article. According to this structure, by determining the blog to be compressed in accordance with the blog compression determination threshold decided based on an index (e.g., the increasing capacity average value) that indicates the increasing tendency of the storage capacity of the blog DB 51 utilized by the blog instead of setting a uniform threshold, the appropriate blog to be compressed is selectable.

When, for example, the compression determining process is executed periodically like once per a day, the blog that has a high increasing tendency (fast increasing speed) of the necessary storage capacity has a relatively high possibility such that the total-data-amount upper limit value allocated to such a blog is exceeded by the article posted during the compression determining process. That is, the blog that has a high increasing tendency of the total data amount can be considered as having no leeway in the available capacity in comparison with the blog that has low increasing tendency. According to the process of the embodiments, a determination can be made with the increasing tendency of the total data amount of the blog being taken into consideration, and thus the article to be compressed can be appropriately selected.

Moreover, a compression and a decompression to the compression have a high process load, but according to these embodiments, the compression and the decompression are avoided as much as possible.

When there is an access request to the compressed article, the blog server 1 may decompress and distribute this article, but the article to be compressed for the storage resource is the article that belongs to the blog which has a low accessibility. Hence, an occasion in which the decompressing process is necessary when an access is made can be reduced as much as possible. This decreases the process load on the blog server 1 to provide the blog.

Moreover, by selectively compress the article that has a low accessibility, the load on the compressing process can be reduced.

In view of the foregoing, according to these embodiments, the compression of the article avoids the tight storage resource, and the appropriate article to be compressed is selectable so as to reduce the process occasion, such as compression or decompression, as much as possible. Moreover, the process load on the server can be reduced, and the performance at the time of viewing can be enhanced.

The blog server 1 according to the first to ninth embodiments includes the compressing and decompressing unit 15 which compresses the article to be compressed among the articles that belong to the blog to be compressed, and which decompresses the already-compressed article when an access request is made to the already-compressed article.

That is, the function as the compressing and decompressing unit 15 compresses the article that is appropriately selected in accordance with the determination by the determining unit 14 through the processes illustrated in FIG. 6, FIG. 9B, FIG. 12, and FIG. 15. Moreover, even if the article is compressed as being determined that the accessibility is low, an access request thereto may sometimes occur. In such a case, however, by executing the decompression through the process in FIG. 7, the article is appropriately presented to the audience who has made the access request.

Hence, appropriate compression and decompression can be executed for avoiding a tight storage resource, and for reducing a process load.

The compressing and decompressing unit 15 of the blog server 1 according to the first to ninth embodiments may compress image data contained in the article determined as to be compressed when the compression is executed as described in the first embodiment.

Depending on the blog, there is a blog on which the article that contains many image data is likely to be posted, and there is also a blog on which the article that contains text data only is likely to be posted. The image data often has a larger capacity than that of the text data, and even if the compression percentage of the image data is lower than the compression percentage of the text data, the compression effect, i.e., the available capacity secured when the compression is executed highly possibly increases. In the case of, for example, the article that contains text data of 5 KB and image data of 30 MB, compression on the text data cannot secure the available capacity that is equal to or larger than 5 KB not matter how much the compression percentage is high. Conversely, the available capacity that is equal to or larger than 5 KB can be sufficiently secured by compressing the image data.

According to this structure, an opportunity to compress the image data which has a high effect can be increased. Moreover, by appropriately compressing both the text data and the image data, the compression effect can be maximized. Furthermore, when the image data is to be compressed, lossy compression as the format of compression is available, and thus a highly effective compression is enabled.

The compressing and decompressing unit 15 of the blog server 1 according to the first to ninth embodiments may compress data other than predetermined data on a header among the data contained in the article determined as to be compressed when the compression is executed.

When one article is displayed on the user terminal 5, depending on the size of the display unit of the user terminal 5, the display size of characters, or the length of the article, the entire article cannot be displayed within a screen in some cases. When, for example, the first half of the article is displayed as the first view on the screen, and the last half of the article is out of the screen, the last half of the article may be possibly viewed after the first half is read. According to this structure, since the predetermined data of the header of the article is stored in the blog DB 51 in an uncompressed status, the data is promptly transmitted without a decompressing process. Accordingly, the audience can view the first half of the article without a frustration. Moreover, since the last half of the article is decompressed and distributed to the user terminal 5 while the audience is viewing, the audience can also view the last half of the article without any problem.

Regarding how much the data contained in the article is stored without being compressed, various schemes are considerable. When, for example, the amount of the compressed part is large, it is estimated that the decompression takes a longer time than usual, and the amount may be stored without compression by what corresponds to an occasion in which a general audience does not complete the viewing until the decompression process completes and the decompressed data is transmitted. That is, the data amount that is stored without a compression may be decided in accordance with the data amount contained in the article.

Moreover, when the plurality of articles contained in the single webpage data is transmitted, respective portions of the plurality of articles not compressed may be initially distributed. In this case, only respective portions of the plurality of articles not compressed are initially displayed in sequence on the screen of the user terminal 5, and when the respective remaining portions of the plurality of articles are decompressed and distributed, such remaining portions are inserted and displayed between the respective articles that have been already displayed. This enables the audience to initially read the header portions of the plurality of articles through a single screen, possibly facilitating the audience to search an interested article.

Note that when one of the plurality of articles contained in the single webpage data is distributed, and when, for example, the article located at the middle portion is displayed on the screen of the user terminal 5 as the first view, it is desirable to start decompressing and distributing the remaining portion of the article that has the header portion displayed. This enables the audience to promptly read the remaining portion of the article which is displayed as the first view and which is being viewed by the audience.

The compressing and decompressing unit 15 of the blog server 1 according to the first to ninth embodiments may execute lossy compression when compressing the image data contained in the article that is determined as the article to be compressed when the compression is executed.

Since the article that has a low possibility to be viewed, i.e., the article that has a low accessibility has a less opportunity to be decompressed, it is desirable to apply lossy compression on the image in the compressing process. This maximizes the securement of the storage resource.

Moreover, the image data compressed by lossy compression has a smaller data amount than that of the image data in an uncompressed status even if being decompressed. Hence, when the compressing process by lossy compression is executed since a given article has a low accessibility, even if the article gets an attention due to some reasons, the accessibility increases, and such an article is decompressed, the necessary storage capacity is smaller than that of the article in an uncompressed status. Therefore, this is advantageous in view of the securement of the storage resource.

In particular, as described in the second embodiment, the compressing and decompressing unit 15 of the blog server 1 may be configured to, when the image data contained in the article to be compressed is compressed by lossless compression and such an article becomes again the article to be compressed, execute lossy compression on the article. That is, the stage until the lossy compression is applied may be divided into two stages that are the primary compression and the secondary compression. The primary compression that is the lossless compression prevents the image from carelessly becoming difficult to view, and the secondary compression that is lossy compression is applied to the article that has truly a low accessibility. This maximizes the securement of the storage resource.

As described in the third embodiment, the blog server 1 may include the blog managing unit 11 that increases or decreases a storage capacity permitted to a poster in accordance with a utilization status of the poster who posts the article on the blog.

The user who has a high blog update frequency has a tendency such that the increasing tendency index increases, the blog is highly possibly determined as the blog to be compressed in the compression determining process, and thus the article is likely to be compressed by the compressing process. In other words, the number of articles in the compressed status increases. Under such a circumstance, if the posting of the articles continues, there would be no article that should be compressed. Consequently, the total data amount of the blog exceeds the total-data-amount upper limit value. In this case, if the positing of the further article is restricted, it becomes not attractive for the describer to utilize the blog service, and it is not suitable for the audience who enjoys the blog of this describer.

Under such a circumstance, it is preferable to set the total-data-amount upper limit value in accordance with the blog utilization status of the describer (poster). Moreover, since utilization of the blog by the describer changes as time advances, by re-adjusting and setting again the total-data-amount upper limit value periodically, etc., an appropriate service in accordance with the describer of the blog can be provided.

Note that the total-data-amount upper limit value may be set in view of not only the describer but also the utilization status of the audience. When, for example, the describer passed away and there is no more posting of a new article, but posting of comments by the audience who has viewed passionately the articles that have been posted by such a describer continues, the necessary storage capacity of such a blog keeps increasing. The total-data-amount upper limit value is set in view of such a utilization status of the blog (i.e., the utilization status in which posting of only the comments continues) in such way that the articles are not likely to become the article to be compressed. This decreases the necessity of the decompressing process when the blog is viewed, avoiding the audience from feeling a performance reduction when viewing.

The determining unit 14 of the blog server 1 according to the ninth embodiment determines that, when the already-compressed article is decompressed in accordance with an access request, the decompressed article as not the article to be compressed for a predetermined time period from the decompression.

According to the ninth embodiment, when the compressed article is decompressed in accordance with an access request, this article is determined as not to be compressed for the predetermined time period from the decompression (see FIG. 18).

When there is an access after the compression and the article is decompressed and distributed, the article can be regarded that a possibility such that an access request would be made increases. Accordingly, the article is decompressed as it is, eliminating the necessity of the decompressing process when the next access request is received.

However, the access may be sporadic, and the article may be still unpopular. Hence, after the predetermined time period has elapsed, the compression may be made as appropriate based on the increasing tendency index of the blog or the accessibility index for each article. This can address a case in which a waste storage resource is consumed by leaving the article as being decompressed, the necessary capacity for storage is reduced, and thus the tightness of the storage resource is avoidable.

The determining unit 14 of the blog server 1 according to the seventh embodiment determines, for the already-compressed article, whether or not to decompress in accordance with a value that indicates the increasing tendency of the page view to the other article in the same blog to be compressed, and the compressing and decompressing unit 15 decompress the article to be compressed in advance in accordance with the determination on whether or not to decompress.

According to the seventh embodiment, a change in popularity degree index of the blog is monitored, and when the increasing tendency of the popularity degree index is detected for a given blog, the determination that the already-compressed article contained in this blog is the article to be decompressed (see FIG. 14).

When the number of accesses to a given blog remarkably increases because of a certain popular article, the other articles contained in this blog have an increasing accessibility in future although not accessed so far. Hence, all the compressed articles in the blog are determined as the articles to be decompressed.

This eliminates the necessity of the decompressing process at a time point at which the actual access is made, and enables a distribution of the article with an excellent response performance.

Note that as a modified example of the process in FIG. 14 according to the seventh embodiment, not all the compressed articles but some compressed articles in the blog determined as the popularity increasing may be determined as the articles to be decompressed. When, for example, the article that has the posted date and time within a predetermined time period in past from the present moment is determined as the article to be decompressed, the large number of articles are not decompressed immoderately, thus suitable to maintain the storage resource. For example, regarding the blog which has a large number of articles posted for a long time, and which has a large number of compressed articles that are relatively old, it is preferable that not all the compressed articles but some compressed articles should be determined as the articles to be decompressed.

Alternatively, when the number of compressed articles is equal to or greater than a predetermined number, only some (e.g., a half) articles may be determined as the articles to be decompressed.

Moreover, when the upper limit of the number of articles to be decompressed is set and there are the compressed articles beyond the upper limit, the articles up to the upper limit number may be determined as the article to be decompressed from the article that has a newer posted date and time.

The determining unit 14 of the blog server 1 according to the eighth embodiment determines whether or not to decompress the already-compressed article based on the contents of the article.

According to the eighth embodiment, the determination on whether or not to decompress the already-compressed article is made based on the contents of the article (see FIG. 16).

For example, as the contents of the compressed article, the article that contains a certain set keyword or current-news word, the article with a specific theme, etc., are picked out, and these articles are determined as the articles to be decompressed.

For example, regarding a blog article that mentions a certain theme, although such an article is not getting attention a lot at a time point at which the article is uploaded, the possibility such that the article is searched increases (i.e., the accessibility increases) few years later because any incident or event relating to the theme mentioned in the article occurs in the world, and the linked number to the article increases.

Accordingly, such a tide is perceived in advance based on the contents of the article, more specifically, the current-news word, the set keyword, and the theme etc., of the article, and the article which has been already compressed but which has an increasing accessibility is decompressed from the compressed status.

This eliminates the necessity of the decompressing process at the time point at which the actual access is made, enabling a prompt distribution of the article.

Note that regarding the compressed article, it becomes difficult to search the contents. Accordingly, the managing DB 53 stores the tag information as the compressed article tag that indicates a keyword and a theme, etc. This facilitates and enables an appropriate decompression determination.

Moreover, tag setting and the tag registration in the managing DB 53 are executed at the time of the compression (see FIG. 6, FIG. 9B, FIG. 12, and FIG. 15). This causes the execution of the processes of setting and registering the tag to be minimum requisite. Hence, an increase in process load is suppressed, and the waste consumption of the storage resource in the DB immoderately is avoided.

The example processes in the above-described embodiments are merely examples, and other various kinds of modified examples are expectable.

When the increasing tendency index of the blog is classified into, for example, equal to or greater than three classifications, regarding the blog that is determined as having the highest increasing tendency index in the low ranking, all the articles may be determined as compression permitted. That is, this is an example in which the determination on whether or not to compress is made for each article based on the increasing tendency index and on the accessibility index with respect to the increasing tendency index between a first level (increasing tendency index is low) and an (n−1)-th level (increasing tendency index is high) with the increasing tendency index being classified into n classes. For the blog in an n-th level (increasing tendency is highest), however, all the articles are determined as compression permitted without a determination on individual article.

In particular, as for a blog which has a high increasing tendency index but has a small number of accesses (viewing and comment writing) of audiences, and describes records for the blog owner only, since the possibility that disrupts the convenience of the audience is low, it is desirable to determined that all the articles are to be compressed without a determination on individual article.

This improves the process efficiency of the blog server 1, reduces the process load, and ensures the storage resource.

The compressing process may be executed multiple times step by step.

For example, the determination on the accessibility is still made on the compressed article as illustrated in FIG. 13. Next, the article which has been already compressed and which has no access for a predetermined time period may be compressed at a higher compression percentage.

For example, in the first-time compression, the compression is executed with the compression percentage that is 20%, in the second-time compression, the compression is executed with the compression percentage that is 50%, and in the third-time compression, the compression is executed with the compression percentage that is 80%.

Moreover, there is also an example in which the first-time compression is a lossless compression, and the second-time compression is a lossy compression.

Furthermore, the first-time compression may be a partial compression on the article, and the second-time compression may be an entire compression on the article.

Still further, the first-time compression may be a compression on only the text in the article, and the second-time compression may be a compression on the image in addition to the text.

Yet still further, the first-time compression may be a compression on only the image in the article, and the second-time compression may be a compression on the text in addition to the image.

Some blogs may be excluded from the blog subjected to the compression determining process.

For example, regarding the blog that is determined as highly popular for a long time, the article contained in this blog may be excluded from the article subjected to the compression determination. This reduces the number of blogs subjected to the processes as illustrated in FIG. 5, FIG. 9A, FIG. 13, FIG. 14, and FIG. 18, etc., making the process efficient.

Similarly, the blog determined that all the articles have been already compressed, in particular, determined as having a quite high increasing tendency index but there is no audience may be excluded from the blog subjected to the decompression determination. This reduces the number of blogs subjected to the processes as illustrated in FIG. 14, and FIG. 16, etc., and making the process efficient.

Note that in the above-described embodiments, the process which is for a so-called blog and an article contained in the blog, and which compresses the article has been described. Such a technology is applicable to a folder in a file system and a file contained in the folder.

That is, the increasing tendency index for the folder is converted into a value that indicates the increasing tendency of the storage resource necessary to store a file in the folder, and a determination on which such a value is reflected is made on whether or not the file is to be compressed with reference to the accessibility of the file.

Moreover, the blog may be a system achieved as a so-called cloud storage.

13. Program and Storage Medium

A program according to an embodiment causes an information processing device (a CPU, etc.) to execute the processes of at least the tendency obtaining unit 12, the threshold setting unit 13, and the determining unit 14 of the blog server 1.

The program according to an embodiment causes an information processing device to execute: a tendency obtaining function of obtaining an increasing tendency of a storage capacity utilized by a blog that contains one or a plurality of articles; a threshold setting function of setting, to the blog, a threshold for determining whether or not to compress at least a part of the article contained in the blog in accordance with the increasing tendency; and a determining function of determining whether or not the blog is to be compressed based on the total data amount of the articles contained in the blog and on the threshold, and determining whether or not to compress each of the articles contained in the blog in accordance with the degree of accessibility.

That is, this program causes the information processing device to execute the processes described with reference to FIG. 5, FIG. 9A, FIG. 13, FIG. 14, and FIG. 18, etc.

Such a program enables an achievement of one or a plurality of the information processing devices as the above-described blog server 1.

Moreover, such a program may be stored in advance in an HDD that is a storage medium built in an apparatus like a computer apparatus, a ROM in a microcomputer that has a CPU, or the like. Alternatively, the program may be temporarily or permanently recorded (stored) in a removable storage medium, such as a semiconductor memory, a memory card, an optical disk, a magneto-optical disc, or a magnetic disk. Furthermore, such a removable storage medium can be provided as a so-called package software.

Still further, such a program may be installed in a personal computer, etc., from the removable storage medium, and also downloadable via a network, such as a LAN or the Internet, from a download site.

REFERENCE SIGNS LIST

1 Blog server, 2 Network, 5 User terminal, 11 Blog managing unit, 12 Tendency obtaining unit, 13 Threshold setting unit, 14 Determining unit, 15 Compressing and decompressing unit, 51 Blog DB, 52 Image DB, 53 Managing DB

The invention claimed is:

1. An information processing device comprising:
at least one memory configured to store computer program code;
at least one processor configured to access said computer program code and operate as instructed by said computer program code, said computer program code including:
tendency obtaining code configured to cause at least one of said at least one processor to obtain an increasing tendency of a storage capacity utilized by a blog that contains at least one article;
threshold setting code configured to cause at least one of said at least one processor to set, to the blog, a threshold for determining whether or not to compress at least a part of the article contained in the blog in accordance with the increasing tendency;
determining code configured to cause at least one of said at least one processor to determine whether or not the blog is to be compressed based on a total data amount of the at least one article contained in the blog and on the threshold, and to determine whether or not to compress each of the at least one article contained in the blog in accordance with a degree of accessibility; and
compressing and decompressing code configured to cause at least one of said at least one processor to compress the article determined to be compressed, and to decompress the already-compressed article when an access is made to the already-compressed article.

2. The information processing device according to claim 1, wherein
the compressing and decompressing code is configured to cause at least one of said at least one processor to compress image data contained in the article determined as to be compressed when the compression is executed.

3. The information processing device according to claim 1, wherein
the compressing and decompressing code is configured to cause at least one of said at least one processor to compress data other than predetermined data on a header among the data contained in the article determined as to be compressed when the compression is executed.

4. The information processing device according to claim 1, further comprising:
blog managing code configured to cause at least one of said at least one processor to increase or decrease a storage capacity permitted to a poster in accordance with a utilization status of the poster who posts the article on the blog.

5. The information processing device according to claim 1, wherein
when the already-compressed article is decompressed in accordance with an access request, the determining code is configured to cause at least one of said at least one processor to determine the decompressed article as not the article to be compressed for a predetermined time period from the decompression.

6. The information processing device according to claim 1, wherein:
the determining code is configured to cause at least one of said at least one processor to determine, for the already-compressed article, whether or not to decompress in accordance with a value that indicates an increasing tendency of a page view to the other article that belongs to the same blog; and
the compressing and decompressing code is configured to cause at least one of said at least one processor to decompress the already-compressed article in advance in accordance with the determination on whether or not to decompress.

7. The information processing device according to claim 1, wherein
the determining code is configured to cause at least one of said at least one processor to determine whether or not to decompress the already-compressed article based on contents of the article.

8. An information processing method comprising:
obtaining an increasing tendency of a storage capacity utilized by a blog that contains at least one article;
setting, to the blog, a threshold for determining whether or not to compress at least a part of the article contained in the blog in accordance with the increasing tendency;
determining whether or not the blog is to be compressed based on a total data amount of the at least one article contained in the one blog and on the threshold;

determining whether or not to compress each of the at least one article contained in the blog in accordance with the degree of accessibility; and performing compression based on the determinations.

9. A non-transitory computer readable storage medium having stored thereon a computer program configured to cause an information processing device to:

obtain an increasing tendency of a storage capacity utilized by a blog that contains at least one article;

set, to the blog, a threshold for determining whether or not to compress at least a part of the article contained in the blog in accordance with the increasing tendency;

determine whether or not the blog is to be compressed based on a total data amount of the at least one article contained in the one blog and on the threshold; and determine whether or not to compress each of the at least one article contained in the blog in accordance with the degree of accessibility; and perform compression based on the determinations.

\* \* \* \* \*